US012522913B2

(12) United States Patent
Maruko et al.

(10) Patent No.: US 12,522,913 B2

(45) Date of Patent: Jan. 13, 2026

(54) SPUTTERING TARGET

(71) Applicant: FURUYA METAL CO., LTD., Tokyo (JP)

(72) Inventors: Tomohiro Maruko, Tokyo (JP); Yu Suzuki, Tokyo (JP); Shohei Otomo, Tokyo (JP); Hironobu Nakamura, Tokyo (JP)

(73) Assignee: FURUYA METAL CO., LTD.

( * ) Notice: Subject to any disclaimer, the term of this patent is extended or adjusted under 35 U.S.C. 154(b) by 196 days.

(21) Appl. No.: 17/625,399

(22) PCT Filed: Jun. 26, 2020

(86) PCT No.: PCT/JP2020/025277

§ 371 (c)(1),
(2) Date: Jan. 7, 2022

(87) PCT Pub. No.: WO2021/019990

PCT Pub. Date: Feb. 4, 2021

(65) Prior Publication Data

US 2024/0043986 A1 Feb. 8, 2024

(30) Foreign Application Priority Data

Jul. 31, 2019 (JP) ................................ 2019-141696
Nov. 26, 2019 (JP) ................................ 2019-213592
(Continued)

(51) Int. Cl.

*C23C 14/34* (2006.01)
*B22F 3/105* (2006.01)
(Continued)

(52) U.S. Cl.

CPC .......... *C23C 14/3414* (2013.01); *B22F 3/105* (2013.01); *B22F 3/24* (2013.01);
(Continued)

(58) Field of Classification Search

None
See application file for complete search history.

(56) References Cited

U.S. PATENT DOCUMENTS 6,329,275 B1 12/2001 Ishigami et al.
6,387,536 B1 5/2002 Takagi et al.
(Continued)

FOREIGN PATENT DOCUMENTS

CN 107847639 A 3/2018
CN 109161858 A 1/2019
(Continued)

OTHER PUBLICATIONS

Kano et al; "Enhancement of Piezoelectric Response in Scandium Aluminum Nitride Alloy Thin Films prepared by Dual Reactive Co-Sputtering"; Advanced Materials, vol. 17; 2012; p. 202-207.
(Continued)

*Primary Examiner* — Jason Berman
(74) *Attorney, Agent, or Firm* — Ohlandt, Greeley and Perle, LLP.

(57) ABSTRACT

The sputtering target of the present disclosure includes: an aluminum matrix; and (1) a material or phase containing aluminum and further containing either a rare earth element or a titanium group element or both a rare earth element and a titanium group element or (2) a material or phase containing either a rare earth element or a titanium group element or both a rare earth element and a titanium group element, at a content of 10 to 70 mol % in the aluminum matrix.

7 Claims, 7 Drawing Sheets

(30) Foreign Application Priority Data

| | | |
|---|---|---|
| Dec. 27, 2019 | (JP) | 2019-237867 |
| Dec. 27, 2019 | (JP) | 2019-237870 |
| Mar. 24, 2020 | (JP) | 2020-052166 |
| Jun. 18, 2020 | (JP) | 2020-105160 |
| Jun. 18, 2020 | (JP) | 2020-105165 |
| Jun. 18, 2020 | (JP) | 2020-105166 |

(51) Int. Cl.

| | |
|---|---|
| ***B22F 3/24*** | (2006.01) |
| ***B22F 9/08*** | (2006.01) |
| ***C22C 1/04*** | (2023.01) |
| ***C22C 1/047*** | (2023.01) |
| ***C22C 1/05*** | (2023.01) |
| ***C22C 21/00*** | (2006.01) |
| ***C22C 29/00*** | (2006.01) |
| ***C22C 29/16*** | (2006.01) |
| ***C22C 32/00*** | (2006.01) |
| ***H01J 37/34*** | (2006.01) |

(52) U.S. Cl.

CPC ............ *B22F 9/082* (2013.01); *C22C 1/0416* (2013.01); *C22C 1/047* (2023.01); *C22C 1/05* (2013.01); *C22C 21/00* (2013.01); *C22C 29/005* (2013.01); *C22C 29/16* (2013.01); *C22C 32/0068* (2013.01); *H01J 37/3429* (2013.01); *B22F 2003/1051* (2013.01); *B22F 2003/247* (2013.01); *B22F 2009/0824* (2013.01); *B22F 2201/20* (2013.01); *B22F 2202/13* (2013.01); *B22F 2301/052* (2013.01); *B22F 2302/20* (2013.01); *B22F 2998/10* (2013.01); *B22F 2999/00* (2013.01)

(56) References Cited

U.S. PATENT DOCUMENTS

| | | | | |
|---|---|---|---|---|
| 2002/0064949 | A1 * | 5/2002 | Shah | B22F 3/23 438/682 |
| 2011/0318607 | A1 | 12/2011 | Kobayashi et al. | |
| 2018/0261439 | A1 * | 9/2018 | Myasnikov | C23C 14/3414 |
| 2019/0161851 | A1 | 5/2019 | Morii et al. | |
| 2020/0090913 | A1 * | 3/2020 | Wilby | C23C 14/345 |

FOREIGN PATENT DOCUMENTS

| | | | |
|---|---|---|---|
| EP | 3467142 | A1 | 4/2019 |
| JP | H08134635 | A | 5/1996 |
| JP | 2000273623 | A | 10/2000 |
| JP | 2000328242 | A | 11/2000 |
| JP | 2001028348 | A | 1/2001 |
| JP | 2006111970 | A | 4/2006 |
| JP | 2010204291 | A | 9/2010 |
| JP | 2003166052 | A | 6/2013 |
| WO | 2017213185 | A | 12/2017 |
| WO | 2018169998 | A | 9/2018 |
| WO | 2021-247813 | A1 | 12/2021 |

OTHER PUBLICATIONS

Japanese Office Action dated Nov. 29, 2021 for Japanese Appl. No. 2020-105166.

International Search Report dated Aug. 25, 2020 for PCT Appl. No. PCT/JP2020/025277.

International Preliminary Report on Patentability (IPRP) dated Feb. 10, 2022 for PCT Appl. No. PCT/JP2020/025277.

Indian Office Action dated Sep. 8, 2022 for Indian Appl. No. 202227010700.

Extended European Search Report dated Sep. 19, 2023 for European Appl. No. 20848288.5.

Korean Office Action (with English translation) dated Feb. 23, 2024 for Korean Application No. 10-2022-7000279.

Decision of Rejection dated May 10, 2024, issued for the corresponding JP patent application No. 2022-517628 with the English translation.

Extended European Search Report (EESR) dated Apr. 19, 2024, issued for the corresponding EP patent application No. 21797629.9.

* cited by examiner

SPUTTERING TARGET

BACKGROUND

1. Field of the Disclosure

The present disclosure relates to a sputtering target suitable for forming a metal film or nitride film having good piezoelectric responsiveness in a piezoelectric element.

2. Discussion of the Background Art

As aging of population proceeds in the modern and the future society, decrease in the working population is predicted, and therefore, also in the manufacturing industry, automation is promoted using the Internet of Things (IoT). Also in the automobile industry, a shift is occurring to a society in which automobiles are manufactured that can be automatically operated not by a person but mainly by artificial intelligence (AI) or the like.

An important technology in automation and automatic operation is ultra-high-speed wireless communication, and high frequency filters are indispensable for ultra-high-speed wireless communication. For increase in the speed of wireless communication, a shift is scheduled from a frequency band 3.4 GHz used in conventional fourth generation mobile communication (4G) to frequency bands 3.7 GHz, 4.5 GHz, and 28 GHz used in fifth generation mobile communication (5G). When this shift occurs, it is technically difficult to use conventional surface acoustic wave (SAW) filters as high frequency filters. Therefore, change from surface acoustic wave filters to bulk acoustic wave (BAW) filters is occurring in the technology.

As a piezoelectric film in BAW filters and piezoelectric element sensors, an aluminum nitride film is mainly used. Aluminum nitride is known to have a high amplitude increase coefficient called a quality factor (Q factor), and is therefore used as a piezoelectric film. However, aluminum nitride cannot be used at a high temperature, and therefore nitride films containing an aluminum element and a rare earth element are promising for obtaining a piezoelectric element having high temperature resistance and a high Q factor.

As a sputtering target to form a nitride film containing an aluminum element and a rare earth element, a sputtering target is disclosed that includes an alloy of Al and Sc, contains from 25 atom % to 50 atom % of Sc, and has an oxygen content of 2,000 ppm by mass or less and a variation in Vickers hardness (Hv) of 20% or less (see, for example, Patent Literature 1). It is described that the sputtering target is produced through a melting step and further plastic working such as a forging step (see, for example, Patent Literature 1). Furthermore, Patent Literature 1 describes that the variation in the Sc content at a top surface of the target (TOP) and a bottom surface of the target (BTM) of the sputtering target is within the range of ±2 atom % (paragraphs 0040 to 0041 in the description).

Furthermore, a $Sc_xAl_{1-x}N$ alloy is known to have a piezoelectric coefficient $d_{33}$ that extremely depends on the composition deviation in the Sc concentration (see, for example, FIG. 3 in Non Patent Literature 1).

CITATION LIST

Patent Literature

Patent Literature 1: WO 2017/213185 A

Non Patent Literature

Non Patent Literature 1: Kazuhiko KANO et al., DENSO TECHNICAL REVIEW Vol. 17, 2012, p. 202 to 207

SUMMARY

The Problems to be Solved by the Disclosure

In Patent Literature 1, the sputtering target includes an alloy of Al and Sc, but the conductivity of the intermetallic compound is lower than that of a metal, so that there is a problem that, for example, the productivity of film formation in a direct current (DC) sputtering device is low.

Furthermore, in manufacture of an aluminum alloy, there is almost no range in which aluminum and an element to be added to aluminum become a complete solid solution because although aluminum has a low melting point of 660° C., the element to be added to aluminum has a very high melting point such as a melting point of 1,541° C. in the case of scandium, 1,522° C. in the case of yttrium, 1,668° C. in the case of titanium, 1,855° C. in the case of zirconium, and 2,233° C. in the case of hafnium, resulting in a difference in melting point between aluminum and the element to be added of 800° C. or more.

Therefore, if scandium is added in a large amount with respect to aluminum as in Patent Literature 1, the melting point is 1,400° C. or more in some compositions, and in such compositions, the degree of growth of the intermetallic compound varies due to the temperature unevenness during solidification after melting, so that it is difficult to produce a sputtering target having a uniform composition in an in-plane direction and a thickness direction of the sputtering target.

Furthermore, if a melting method is used and only an intermetallic compound is included as in Patent Literature 1, a very hard and brittle sputtering target is obtained, and even if an ingot is formed by melting, a crack or the like is likely to occur in the sputtering target during plastic working such as forging.

Furthermore, if a sputtering target is produced with a melting method as in Patent Literature 1, a precipitated phase grows greatly, and composition unevenness occurs in the in-plane direction and the thickness direction of the sputtering target, so that even if a thin film is formed by sputtering, the composition distribution of the obtained alloy thin film is unstable.

Although Patent Literature 1 describes that the variation in the Sc content at the TOP and the BTM of the sputtering target is within the range of ±2 atom %, it is also necessary to suppress the variation not only in the thickness direction but also in the in-plane direction in order to obtain the homogeneity of the formed film.

As particularly pointed out in FIG. 3 in Non Patent Literature 1, the characteristic may extremely change due to composition deviation, and therefore it is important to maintain a uniform composition in the in-plane direction and the thickness direction.

Therefore, an object of the present disclosure is to provide a sputtering target that has improved conductivity and, for example, improves productivity of film formation using a DC sputtering device.

Solution to Solve the Problem

As a result of intensive studies to solve the above-described problems, the present inventors have found that the conductivity of the sputtering target is improved by filling the gap in the intermetallic compound or the nitride with aluminum and thus the above-described problems are solved, and have completed the present disclosure. That is, the sputtering target according to the present disclosure includes: an aluminum matrix; and (1) a material or phase containing aluminum and further containing either a rare earth element or a titanium group element or both a rare earth element and a titanium group element or (2) a material or phase containing either a rare earth element or a titanium group element or both a rare earth element and a titanium group element, at a content of 10 to 70 mol % in the aluminum matrix.

In the sputtering target according to the present disclosure, it is preferable that a difference between the composition of the sputtering target and a reference composition be within ±3% both in an in-plane direction of a sputter surface and in a target thickness direction under (Condition 1) or (Condition 2), and the reference composition be an average of compositions at 18 sites in total measured in accordance with (Condition 1) or (Condition 2).

Condition 1

In-plane direction of the sputter surface: The sputtering target is a disk-shaped target having a center O and a radius of r, and measurement sites for composition analysis are 9 sites in total including, on imaginary crossing lines orthogonally crossing at the center O as an intersection, 1 site at the center O, 4 sites 0.45 r away from the center O, and 4 sites 0.9 r away from the center O.

Target thickness direction: A cross section including one of the imaginary crossing lines is formed, the cross section is a rectangle having a longitudinal length of t (that is, the target has a thickness of t) and a lateral length of 2r, and measurement sites for composition analysis are 9 sites in total including 3 sites, on a vertical transversal passing through the center O, at a center X and 0.45t away from the center X upward and downward (referred to as a point a, a point X, and a point b) and including, on the cross section, 2 sites 0.9 r away from the point a toward left and right sides, 2 sites 0.9 r away from the point X toward the left and right sides, and 2 sites 0.9 r away from the point b toward the left and right sides.

Condition 2

In-plane direction of the sputter surface: The sputtering target has a rectangle shape having a longitudinal length of L1 and a lateral length of L2 (note that examples of the rectangle include a square in which L1 and L2 are equal and a rectangle obtained by developing a side surface of a cylindrical shape having a length J and a circumferential length K, and in a form of this rectangle, L2 corresponds to the length J, L1 corresponds to the circumferential length K, and the length J and the circumferential length K have a relationship of J>K, J=K, or J<K), and measurement sites for composition analysis are 9 sites in total including, on imaginary crossing lines orthogonally crossing at a center of gravity O as an intersection in a case where each line orthogonally crosses a side of the rectangle, 1 site at the center of gravity O, 2 sites away by a distance of 0.25L1 from the center of gravity O on the imaginary crossing line in the longitudinal direction, 2 sites away by a distance of 0.25L2 from the center of gravity O in the lateral direction, 2 sites away by a distance of 0.45L1 from the center of gravity O in the longitudinal direction, and 2 sites away by a distance of 0.45L2 from the center of gravity O in the lateral direction.

Target thickness direction: A cross section including one imaginary crossing line that is parallel to any one of a longitudinal side having a length of L1 and a lateral side having a length of L2 is formed, and in a case where the imaginary crossing line is parallel to the lateral side having a length of L2, the cross section is a rectangle having a longitudinal length of t (that is, the target has a thickness of t) and a lateral length of L2, and measurement sites for composition analysis are 9 sites in total including 3 sites, on a vertical transversal passing through the center of gravity O, at a center X and 0.45 t away from the center X upward and downward (referred to as a point a, a point X, and a point b) and including, on the cross section, 2 sites 0.45L2 away from the point a toward left and right sides, 2 sites 0.45L2 away from the point X toward the left and right sides, and 2 sites 0.45L2 away from the point b toward the left and right sides.

The sputtering target has a uniform composition in the in-plane direction of the sputter surface and in the target thickness direction by reducing the deviation of the composition from the reference composition in the in-plane direction of the sputter surface and in the target thickness direction, and in forming a thin film to be used in a piezoelectric element or the like, it is possible to suppress reduction in the yield caused by a change in the characteristic such as piezoelectric responsiveness due to composition deviation.

In the sputtering target according to the present disclosure, an intermetallic compound including at least two elements selected from aluminum, a rare earth element, or a titanium group element is preferably present in the sputtering target. The variation in composition can be suppressed by reducing the number of sites of a single rare earth element and a single titanium group element. The presence of the intermetallic compound in the target lessens the difference in sputtering rate between the metal elements, and thus reduces the composition unevenness in the obtained film.

In the sputtering target according to the present disclosure, the intermetallic compound may include one, two, three, or four kinds of intermetallic compounds being present in the sputtering target. The variation in composition can be suppressed by reducing the number of sites of a single rare earth element and a single titanium group element. The presence of the one or more kinds of the intermetallic compounds further lessens the difference in sputtering rate between the metal elements, and thus further reduces the composition unevenness in the obtained film.

In the sputtering target according to the present disclosure, at least one nitride of at least one element selected from aluminum, a rare earth element, or a titanium group element may be present in the sputtering target. In forming a nitride film of a piezoelectric element, the piezoelectric element can withstand a high temperature and can have a high Q factor.

In the sputtering target according to the present disclosure, the rare earth element is preferably at least one of scandium or yttrium. In forming a nitride film of a piezoelectric element, the piezoelectric element can withstand a high temperature and can have a high Q factor.

In the sputtering target according to the present disclosure, the titanium group element is preferably at least one of titanium, zirconium, or hafnium. In forming a nitride film of a piezoelectric element, the piezoelectric element can withstand a high temperature and can have a high Q factor.

The sputtering target according to the present disclosure preferably has an oxygen content of 500 ppm or less. In the sputtering target, formation of a strongly bound compound is suppressed, and in forming a thin film using the sputtering target, the formed thin film can have good orientation. Furthermore, reduction in the electrical conductivity can be suppressed, and the formed thin film can have a good yield while generation of particles is suppressed.

Advantageous Effects of Disclosure

Because the sputtering target of the present disclosure has a microstructure in which the gap in the intermetallic compound or the nitride is filled with aluminum, the sputtering target has improved conductivity, and for example, can improve productivity in forming a film using a DC sputtering device.

DETAILED DESCRIPTION OF THE PREFERRED EMBODIMENT

Hereinafter, the present disclosure will be described in detail with reference to embodiments, but the present disclosure is not construed as being limited to these descriptions. The embodiments may be variously modified as long as an effect of the present disclosure is exhibited.

Figure 1:
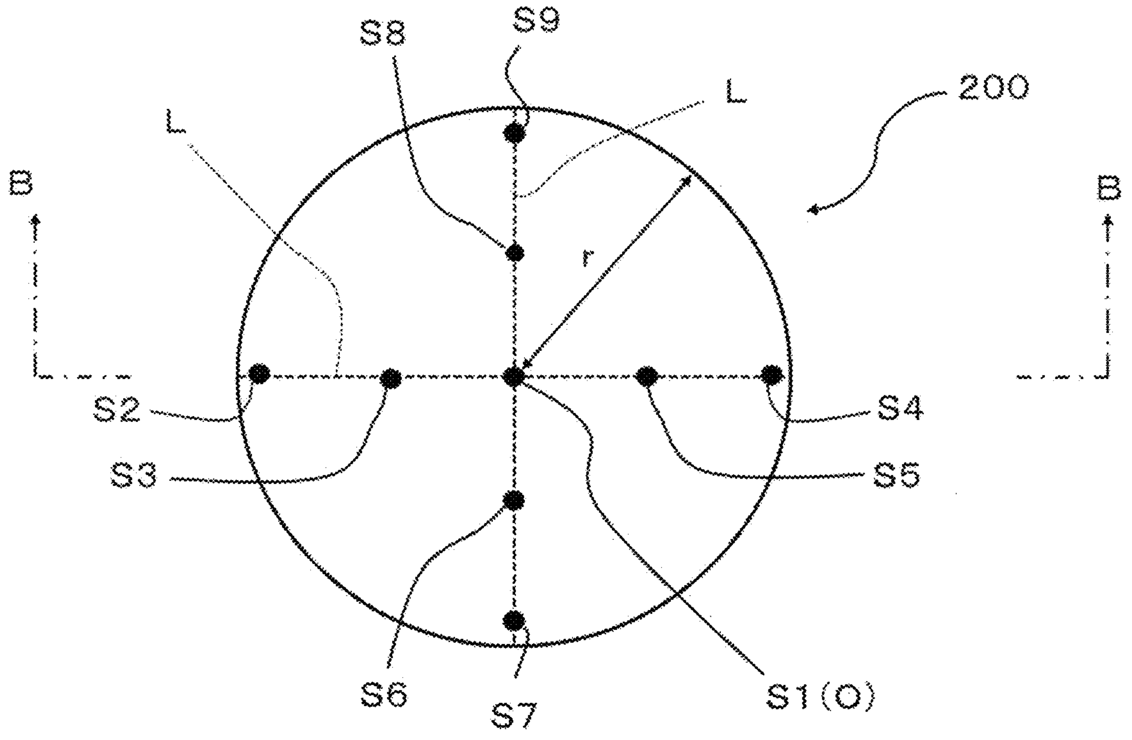
FIG. 1 is a schematic view showing measurement sites in composition analysis of a disk-shaped target in an in-plane direction of a sputter surface.

FIG. 1 is a schematic view showing measurement sites in composition analysis of a disk-shaped target in an in-plane direction of a sputter surface (hereinafter, also referred to as measurement sites), and the measurement sites in the sputtering target in the in-plane direction of the sputter surface under (Condition 1) will be described with reference to FIG. 1. In the case of a disk-shaped target, the radius is preferably 25 to 225 mm, and more preferably 50 to 200 mm. The thickness of the target is preferably 1 to 30 mm, and more preferably 3 to 26 mm. In the present embodiment, a larger target is expected to be more effective.

FIG. 1 shows a sputtering target 200 that is a disk-shaped target having a center O and a radius of r. The measurement sites are 9 sites in total including, on imaginary crossing lines (L) orthogonally crossing at the center O as an intersection, 1 site at the center O (S1), 4 sites 0.45 r away from the center O (S3, S5, S6, and S8), and 4 sites 0.9 r away from the center O (S2, S4, S7, and S9).

Figure 2:
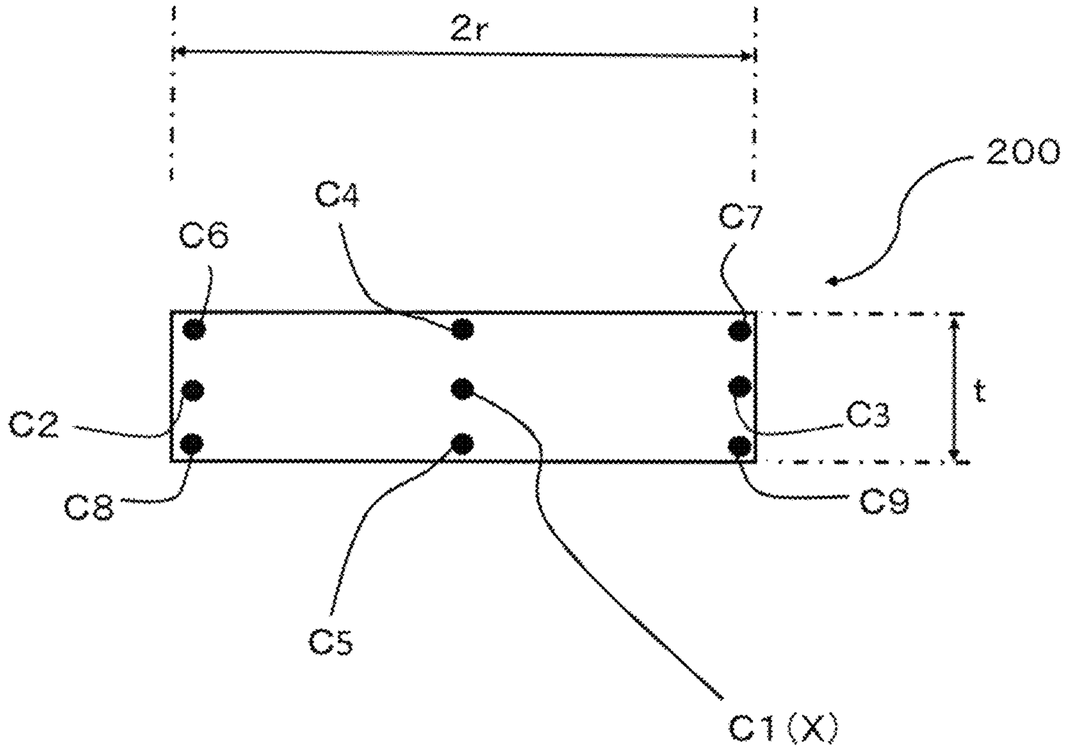
FIG. 2 is a schematic view showing measurement sites in composition analysis, in a target thickness direction, of the disk-shaped target illustrated in a B-B cross section.

FIG. 2 is a schematic view showing measurement sites in composition analysis, in a target thickness direction, of the disk-shaped target illustrated in the B-B cross section in FIG. 1, and the measurement sites in the sputtering target in the target thickness direction under (Condition 1) will be described with reference to FIG. 2.

In FIG. 2, the B-B cross section in FIG. 1 is a rectangle having a longitudinal length of t (that is, the target has a thickness of t) and a lateral length of 2r. The measurement sites are 9 sites in total including 3 sites, on a vertical transversal passing through the center O, at a center X (C1) and 0.45t away from the center X upward and downward (referred to as a point a (C4), a point X (C1), and a point b (C5)) and including, on the cross section, 2 sites 0.9r away from the point a toward left and right sides (C6 and C7), 2 sites 0.9r away from the point X toward the left and right sides (C2 and C3), and 2 sites 0.9r away from the point b toward the left and right sides (C8 and C9).

Figure 3:
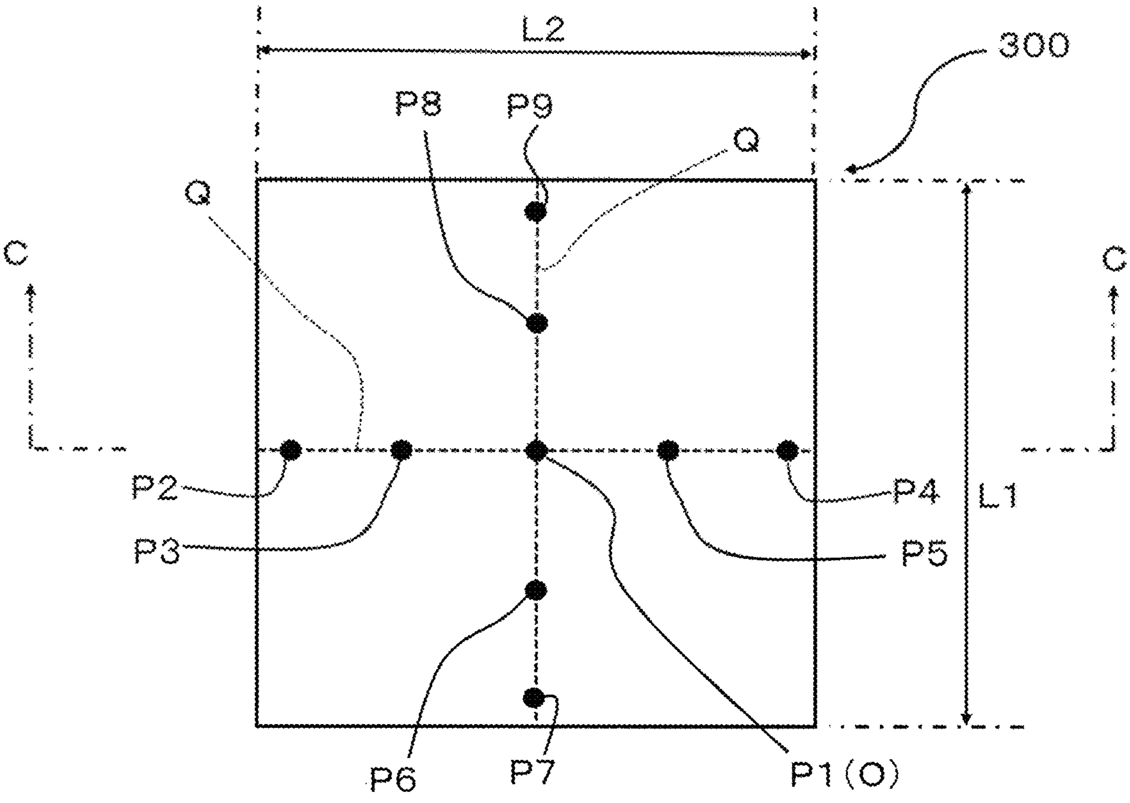
FIG. 3 is a schematic view showing measurement sites in composition analysis of a square plate-shaped target in an in-plane direction of a sputter surface.

FIG. 3 is a schematic view showing measurement sites in composition analysis of a square plate-shaped target in an in-plane direction of a sputter surface, and the measurement sites in the sputtering target in the in-plane direction of the sputter surface under (Condition 2) will be described with reference to FIG. 3. In the case of a rectangular or square target, the longitudinal length and the lateral length are preferably 50 to 450 mm, and more preferably 100 to 400 mm. The thickness of the target is preferably 1 to 30 mm, and more preferably 3 to 26 mm. In the present embodiment, a larger target is expected to be more effective.

A sputtering target 300 is a rectangular target having a longitudinal length of L1 and a lateral length of L2 (however, a square in which L1 and L2 are equal is included), and FIG. 3 illustrates a form in which the sputtering target 300 has the longitudinal length of L1 and the lateral length of L2 that are equal. The measurement sites are 9 sites in total including, on imaginary crossing lines (Q) orthogonally crossing at a center of gravity O as an intersection in a case where each line orthogonally crosses the side of the rectangle (or square), 1 site at the center of gravity O (P1), 2 sites away by a distance of 0.25L1 from the center of gravity O on the imaginary crossing line in the longitudinal direction (P6 and P8), 2 sites away by a distance of 0.25L2 from the center of gravity O in the lateral direction (P3 and P5), 2 sites away by a distance of 0.45L1 from the center of gravity O in the longitudinal direction (P7 and P9), and 2 sites away by a distance of 0.45L2 from the center of gravity O in the lateral direction (P2 and P4). In a case where the sputtering target is rectangular, L1 and L2 can be appropriately selected regardless of the length of each side.

Figure 4:
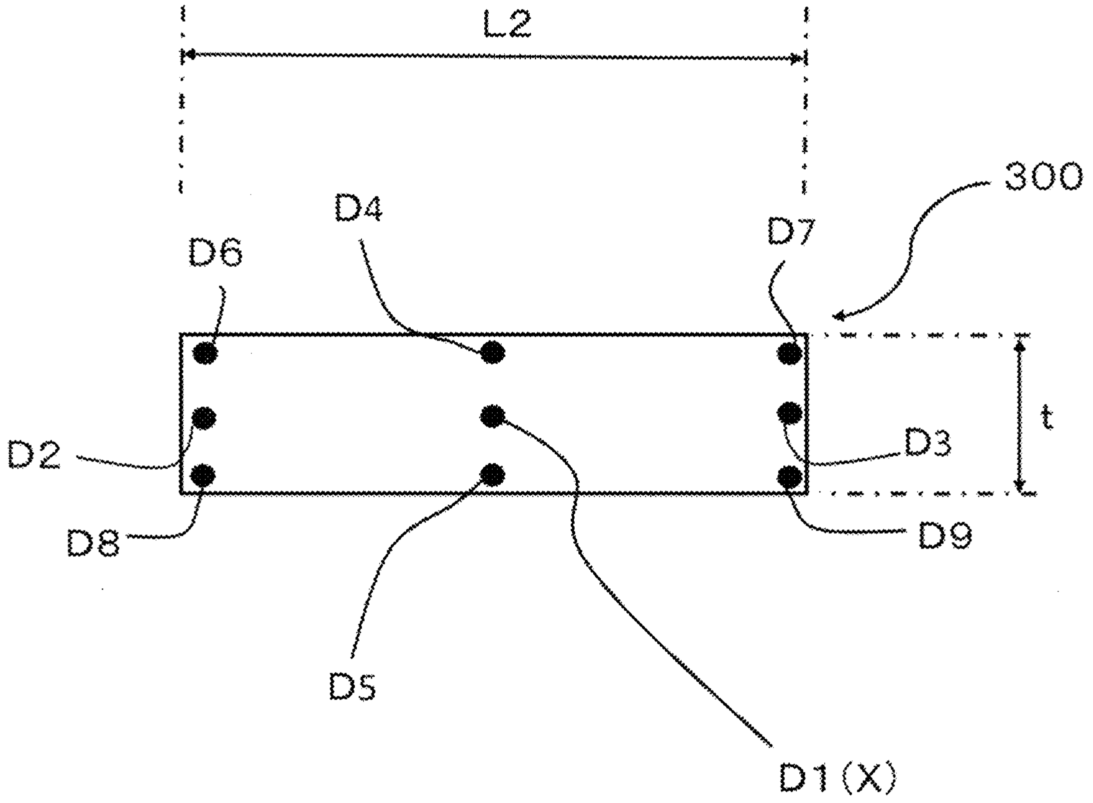
FIG. 4 is a schematic view showing measurement sites in composition analysis, in a target thickness direction, of the square plate-shaped target illustrated in a C-C cross section.

FIG. 4 is a schematic view showing measurement sites in composition analysis, in a target thickness direction, of the square plate-shaped target illustrated in the C-C cross section in FIG. 3, and the measurement sites in the sputtering target in the target thickness direction under (Condition 2) will be described with reference to FIG. 4.

In FIG. 4, the C-C cross section in FIG. 3 forms a cross section including a line that is parallel to the lateral side, the cross section is a rectangle having a longitudinal length of t (that is, the target has a thickness of t) and a lateral length of L2, and the measurement sites are 9 sites in total including 3 sites, on a vertical transversal passing through the center of gravity O, at a center X and 0.45t away from the center X upward and downward (referred to as a point a (D4), a point X (D1), and a point b (D5)) and including, on the cross section, 2 sites 0.45L2 away from the point a toward left and right sides (D6 and D7), 2 sites 0.45L2 away from the point X toward the left and right sides (D2 and D3), and 2 sites 0.45L2 away from the point b toward the left and right sides (D8 and D9).

(Cylindrical Sputtering Target)

Figure 5:
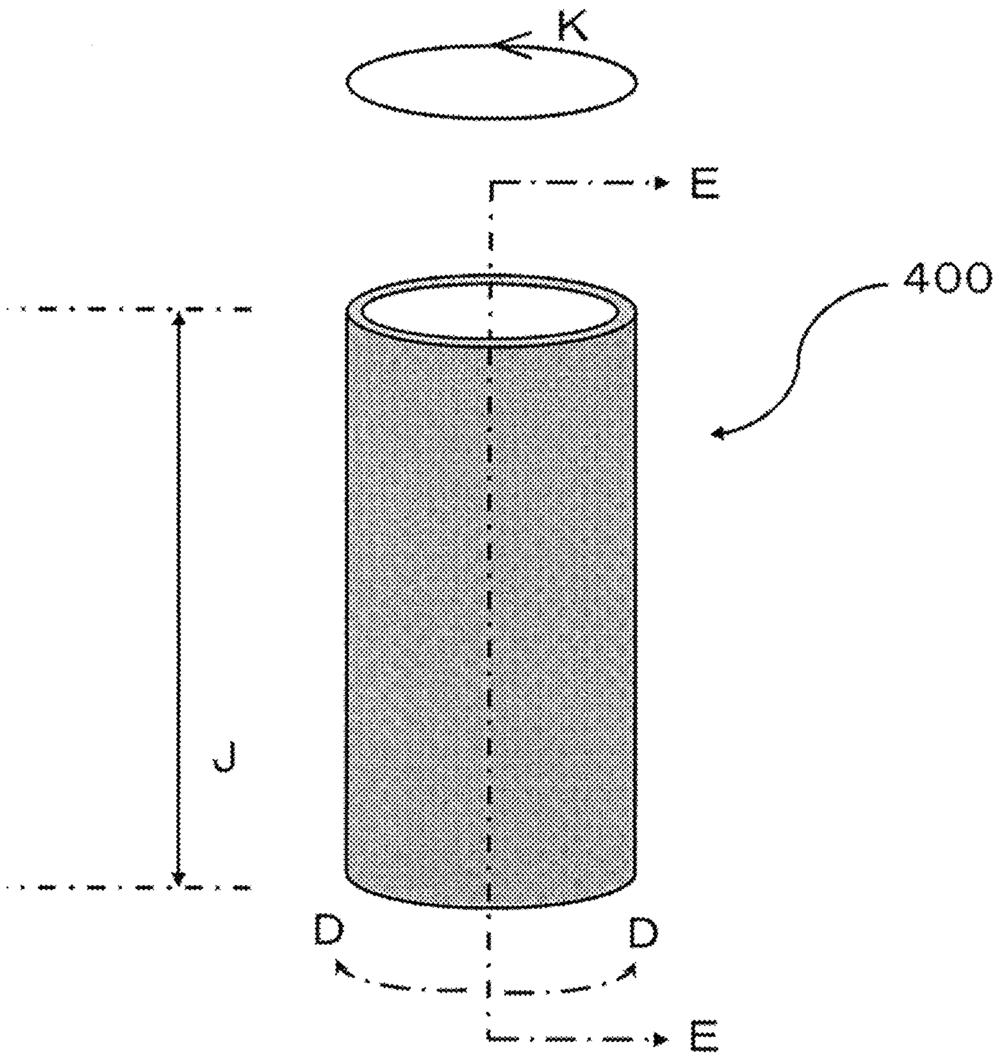
FIG. 5 is a conceptual view to explain measurement sites in composition analysis of a cylindrical target.

FIG. 5 is a conceptual view to explain measurement sites in a cylindrical target. In the case of the sputtering target having a cylindrical shape, the side surface of the cylinder is a sputter surface, and the development view is a rectangle or a square, and therefore (Condition 2) can be considered in the same manner as in the case of FIGS. 3 and 4. In FIG. 5, in the case of a sputtering target 400 having a cylindrical shape having a height (length) of J and a body circumference length of K, an E-E cross section and a D-D development surface are considered so that the E-E cross section is one of ends of the D-D development surface. First, the measurement sites in the composition analysis in the target thickness direction are considered in the same manner as in FIG. 4 in the E-E cross section. That is, it is considered that the height J of the cylindrical material corresponds to L2 in FIG. 4 and the thickness of the cylindrical material corresponds to the thickness t in FIG. 4, and the measurement point is set. In addition, the measurement sites in the in-plane direction of the sputter surface are considered in the same manner as in FIG. 3 in the D-D development surface. That is, it is considered that the height J of the cylindrical material corresponds to L2 in FIG. 3 and the peripheral length K of the body of the cylindrical material corresponds to L1 in FIG. 3. The length of J and the circumferential length of K have a relationship of J>K, J=K, or J<K. In the case of a cylindrical target, the body circumference length of the cylinder is preferably 100 to 350 mm, and more preferably 150 to 300 mm. The length of the cylinder is preferably 300 to 3,000 mm, and more preferably 500 to 2,000 mm. The thickness of the target is preferably 1 to 30 mm, and more preferably 3 to 26 mm. In the present embodiment, a larger target is expected to be more effective.

The sputtering target according to the present embodiment includes: an aluminum matrix; and (1) a material or phase containing aluminum and further containing either a rare earth element or a titanium group element or both a rare earth element and a titanium group element or (2) a material or phase containing either a rare earth element or a titanium group element or both a rare earth element and a titanium group element, at a content of 10 to 70 mol % in the aluminum matrix. If the material or phase is included at a content of less than 10 mol % based on the entire sputtering target, the piezoelectric characteristic is not largely different from that of an existing aluminum nitride film formed using a conventional target, and in a case where the included material or phase is a nitride, the amount of a flowing nitrogen gas in reactive sputtering is to be similar to that in reactive sputtering in which a conventional Al target or Al—Sc target is used to form a nitride film. If the material or phase is included at a content of more than 70 mol % based on the entire sputtering target, the conductivity of the target is low in some cases due to a small proportion of the aluminum matrix, or the like. The material or phase is preferably included at a content of 15 to 67 mol %, and more preferably 20 to 50 mol %, based on the entire sputtering target.

In the sputtering target according to the present embodiment, a difference between the composition of the sputtering target and a reference composition is within ±3%, preferably ±2%, and more preferably ±1% with respect to the reference composition both in the in-plane direction of the sputter surface and in the target thickness direction under (Condition 1) or (Condition 2). Here, the reference composition is an average of compositions at 18 sites in total measured in accordance with (Condition 1) or (Condition 2). If the difference from the reference composition is more than ±3%, the sputtering rate may vary during film formation with the sputtering target, and when a piezoelectric film or the like of a piezoelectric element is formed, the piezoelectric film in each substrate may have a different piezoelectric characteristic, and even in the same substrate, each site in the piezoelectric film may have a different piezoelectric characteristic due to the different composition. Therefore, in order to suppress deterioration of the yield of a piezoelectric element, it is preferable to control the composition of the sputtering target in the in-plane direction of the sputter surface and in the target thickness direction so that the difference from the reference composition is within ±3%.

Next, specific microstructures of the sputtering target will be described. The specific microstructures of the sputtering target are classified into, for example, a first structure to a fifth structure and modified examples thereof. Here, structures having a form in which the aluminum matrix is included are the second structure, the fifth structure, and modified examples thereof. The present embodiment particularly includes the second structure and the second structure-2 as a modified example of the second structure, and the fifth structure and the fifth structure-2 as a modified example of the fifth structure.

[First Structure]

The sputtering target according to the present embodiment has the first structure including at least one of a material containing aluminum and a rare earth element (hereinafter, also referred to as RE), a material containing aluminum and a titanium group element (hereinafter, also referred to as TI), or a material containing aluminum, a rare earth element, and a titanium group element. That is, the first structure has a form including any one of the seven combinations of materials, that is, a form in which a material A containing Al and an RE, a material B containing Al and a TI, or a material C containing Al, an RE, and a TI is present, or a form in which both the material A and the material B, both the material A and the material C, both the material B and the material C, or all of the material A, the material B, and the material C are present.

In the present description, the term “material” means a material included in the sputtering target, and an example of the material is an alloy or a nitride. Furthermore, examples of the alloy include solid solutions, eutectics, and intermetallic compounds. Note that a nitride that is metal-like may be contained in the alloy.

[Second Structure]

The sputtering target according to the present embodiment has the second structure in which at least one of a material containing aluminum and a rare earth element, a material containing aluminum and a titanium group element, or a material containing aluminum, a rare earth element, and a titanium group element is present in an aluminum matrix. That is, in the second structure, any one of the seven combinations of materials, listed for the first structure, is present in the aluminum matrix. That is, the second structure has a form including a combination, that is, a form in which the material A, the material B, or the material C is present in the aluminum matrix, or a form in which both the material A and the material B, both the material A and the material C, both the material B and the material C, or all of the material A, the material B, and the material C are present in the aluminum matrix.

Figure 6:
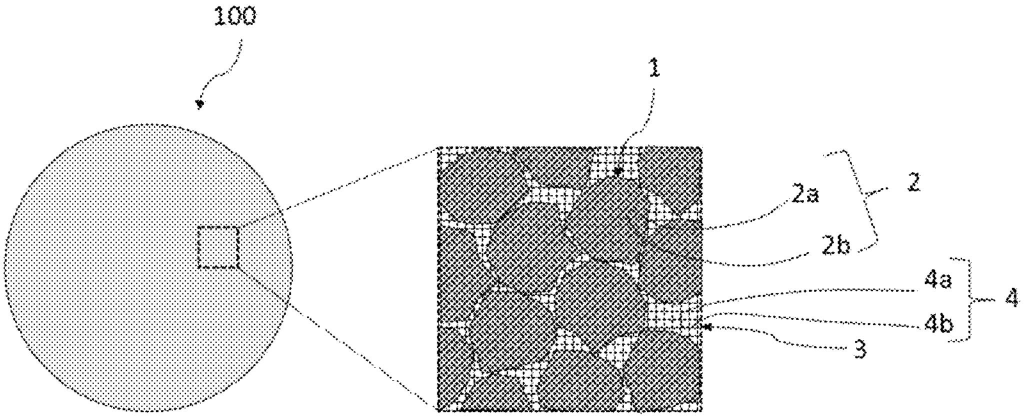
FIG. 6 is an explanatory view to explain a concept of an aluminum matrix.

In the present description, the term "aluminum matrix" can be also referred to as aluminum matrix phase. FIG. 6 explains a concept of an aluminum matrix using the second structure as an example. A sputtering target 100 has a microstructure in which a material containing aluminum and a rare earth element, specifically, an Al-RE alloy is present in an aluminum matrix. That is, a plurality of Al-RE alloy particles 1 are attached to each other via an Al matrix 3. Each of the Al-RE alloy particles 1 is an aggregate of Al-RE alloy crystal grains 2. A boundary between an Al-RE alloy crystal grain 2*a* and an adjacent Al-RE alloy crystal grain 2*b* is a grain boundary. The Al matrix 3 is an aggregate of aluminum crystal grains 4. A boundary between an aluminum crystal grain 4*a* and an adjacent aluminum crystal grain 4*b* is a grain boundary. As described above, in the present description, the term "matrix" means a phase attaching a plurality of metal particles, alloy particles, or nitride particles to each other, and in the concept of the matrix, the phase, attaching particles, itself is an aggregate of crystal grains. In general, an intermetallic compound or a nitride is characterized in that an electrical conductivity and a plastic workability (ductility) thereof, which are characteristics of a metal, are poor. In a case where the Al-RE alloy of the sputtering target consists of only an intermetallic compound, only a nitride, or an intermetallic compound and a nitride, the electrical conductivity of the sputtering target tends to deteriorate. However, if an aluminum (matrix) phase is present, deterioration of the electrical conductivity of the entire sputtering target can be prevented. Furthermore, in a case where the Al-RE alloy of the sputtering target consists of only an intermetallic compound, only a nitride, or an intermetallic compound and a nitride, the sputtering target tends to be very brittle. However, if an aluminum (matrix) phase is present, the brittleness of the target can be lessened.

[Third Structure]

The sputtering target according to the present embodiment has a third structure including a composite phase including a phase consisting of aluminum and an inevitable impurity as metal species, and including either a phase consisting of a rare earth element and an inevitable impurity as metal species or a phase consisting of a titanium group element and an inevitable impurity as metal species or both a phase consisting of a rare earth element and an inevitable impurity as metal species and a phase consisting of a titanium group element and an inevitable impurity as metal species. That is, the third structure has a form including any one of the three combinations, that is, a form including a composite phase including a phase containing aluminum as a metal species and a phase containing a rare earth element as a metal species, a form including a composite phase including a phase containing aluminum as a metal species and a phase containing a titanium group element as a metal species, or a form including a composite phase including a phase containing aluminum as a metal species, a phase containing a rare earth element as a metal species, and a phase containing a titanium group element as a metal species.

Examples of the inevitable impurity include Fe and Ni, and the concentration by atomic percentage of the inevitable impurity is, for example, preferably 200 ppm or less, and more preferably 100 ppm or less.

In the present description, the term "phase" expresses a concept of an aggregate that is a solid phase and is grouped according to the composition, for example, an aggregate of particles having the same composition.

In the present description, the term "composite phase" expresses a concept of a state in which two or more kinds of "phases" are present. Each kind of phase of these phases has a different composition.

[Fourth Structure]

The sputtering target according to the present embodiment has a fourth structure including a composite phase including a phase containing aluminum and either a rare earth element or a titanium group element or both a rare earth element and a titanium group element, and including at least one of a phase consisting of aluminum and an inevitable impurity as metal species, a phase consisting of a rare earth element and an inevitable impurity as metal species, or a phase consisting of a titanium group element and an inevitable impurity as metal species. That is, the fourth structure includes any one of the following 21 combinations of phases. Here, a phase containing aluminum and a rare earth element is referred to as a phase D, a phase containing aluminum and a titanium group element is referred to as a phase E, and a phase containing aluminum, a rare earth element, and a titanium group element is referred to as a phase F. Furthermore, a phase consisting of aluminum and an inevitable impurity as metal species is referred to as a phase G, a phase consisting of a rare earth element and an inevitable impurity as metal species is referred to as a phase H, and a phase consisting of a titanium group element and an inevitable impurity as metal species is referred to as a phase I. The fourth structure includes a composite phase including the following phases, that is, phase D and phase G, phase D and phase H, phase D and phase I, phase D, phase G, and phase H, phase D, phase G, and phase I, phase D, phase H, and phase I, phase D, phase G, phase H, and phase I, phase E and phase G, phase E and phase H, phase E and phase I, phase E, phase G, and phase H, phase E, phase G, and phase I, phase E, phase H, and phase I, phase E, phase G, phase H, and phase I, phase F and phase G, phase F and phase H, phase F and phase I, phase F, phase G, and phase H, phase F, phase G, and phase I, phase F, phase H, and phase I, or phase F, phase G, phase H, and phase I.

[Fifth Structure]

The sputtering target according to the present embodiment has a fifth structure including, in an aluminum matrix, at least a composite phase including either a phase consisting of a rare earth element and an inevitable impurity as metal species or a phase consisting of a titanium group element and an inevitable impurity as metal species or both a phase consisting of a rare earth element and an inevitable impurity as metal species and a phase consisting of a titanium group element and an inevitable impurity as metal species. The fifth structure includes any one of the following three composite phases in an aluminum matrix. That is, the fifth structure includes a composite phase in which a phase H is present in an aluminum matrix, a composite phase in which a phase I is present in an aluminum matrix, or a composite phase in which a phase H and a phase I are present in an aluminum matrix.

In the present description, the term "aluminum matrix" can be also referred to as aluminum matrix phase. In the sputtering target, the fifth structure has a microstructure, in which a phase H, a phase I, or both a phase H and a phase I are present in an aluminum matrix, forming a composite phase. The aluminum matrix is an aggregate of aluminum crystal grains, and a boundary between an aluminum crystal grain and an adjacent aluminum crystal grain is a grain boundary. The phase H is, for example, a concept of an aggregate of particles having the same composition. The phase I is the same as the above. In a case where both the phase H and the phase I are present, two phases having different compositions are present in the aluminum matrix.

[Modified Example of Fifth Structure]

In the sputtering target according to the present embodiment, forms of the fifth structure include a form in which the composite phase further includes a phase consisting of aluminum and an inevitable impurity as metal species.

The fifth structure includes any one of the following three composite phases in an aluminum matrix. That is, the composite phases are a composite phase in which a phase H and a phase G are present in an aluminum matrix, a composite phase in which a phase I and a phase G are present in an aluminum matrix, and a composite phase in which a phase H, a phase I, and a phase G are present in an aluminum matrix.

Forms of the first structure to the fifth structure and the modified example of the fifth structure further include the following forms.

[First Structure-2]

An example of the form is a form in which the sputtering target according to the present embodiment has the first structure and the material is an alloy, a form in which the sputtering target has the first structure and the material is a nitride, or a form in which the sputtering target has the first structure and the material is a combination of an alloy and a nitride. Here, the materials are combined into any one of the seven forms, that is, a form in which a material A containing Al and an RE, a material B containing Al and a TI, or a material C containing Al, an RE, and a TI is present, or a form in which both the material A and the material B, both the material A and the material C, both the material B and the material C, or all of the material A, the material B, and the material C are present.

[Second Structure-2]

An example of the form is a form in which the sputtering target according to the present embodiment has the second structure and the material is an alloy, a form in which the sputtering target has the second structure and the material is a nitride, or a form in which the sputtering target has the second structure and the material is a combination of an alloy and a nitride. Here, the material is any one of the seven combinations of materials listed in [First Structure].

[Third Structure-2]

An example of the form is a form in which the sputtering target according to the present embodiment has the third structure and the composite phase is a composite of metal phases, a form in which the sputtering target has the third structure and the composite phase is a composite of nitride phases, or a form in which the sputtering target has the third structure and the composite phase is a composite of a metal phase and a nitride phase. Here, the phrase "the composite phase is a composite of metal phases" means that the composite phase is a composite phase including an Al phase and an RE phase, a composite phase including an Al phase and a TI phase, or a composite phase including an Al phase, an RE phase, and a TI phase. The phrase "the composite phase is a composite of nitride phases" means that the composite phase is a composite phase including an AlN phase and an REN phase, a composite phase including an AlN phase and a TIN phase, or a composite phase including an AlN phase, an REN phase, and a TIN phase. Furthermore, the phrase "the composite phase is a composite of a metal phase and a nitride phase" means, for example, the composite phase is a composite phase including an Al phase and an REN phase, a composite phase including an AlN phase and an RE phase, a composite phase including an Al phase, an AlN phase, and an RE phase, a composite phase including an Al phase, an AlN phase, and an REN phase, a composite phase including an Al phase, an RE phase, and an REN phase, a composite phase including an AlN phase, an RE phase, and an REN phase, a composite phase including an Al phase, an AlN phase, an RE phase, and an REN phase, a composite phase including an Al phase and a TIN phase, a composite phase including an AlN phase and a TI phase, a composite phase including an Al phase, an AlN phase, and a TI phase, a composite phase including an Al phase, an AlN phase, and a TIN phase, a composite phase including an Al phase, a TI phase, and a TIN phase, a composite phase including an AlN phase, a TI phase, and a TIN phase, a composite phase including an Al phase, an AlN phase, a TI phase, and a TIN phase, a composite phase including an Al phase, an AlN phase, an RE phase, and a TI phase, a composite phase including an Al phase, an AlN phase, an REN phase, and a TI phase, a composite phase including an Al phase, an AlN phase, an RE phase, and a TIN phase, a composite phase including an Al phase, an AlN phase, an REN phase, and a TIN phase, a composite phase including an Al phase, an RE phase, an REN phase, and a TI phase, a composite phase including an AlN phase, an RE phase, an REN phase, and a TI phase, a composite phase including an Al phase, an RE phase, an REN phase, and a TIN phase, a composite phase including an AlN phase, an RE phase, an REN phase, and a TIN phase, a composite phase including an Al phase, an RE phase, a TI phase, and a TIN phase, a composite phase including an AlN phase, an RE phase, a TI phase, and a TIN phase, a composite phase including an Al phase, an REN phase, a TI phase, and a TIN phase, a composite phase including an AlN phase, an REN phase, a TI phase, and a TIN phase, a composite phase including an Al phase, an AlN phase, an RE phase, an REN phase, and a TI phase, a composite phase including an Al phase, an AlN phase, an RE phase, an REN phase, and a TIN phase, a composite phase including an Al phase, an AlN phase, an RE phase, a TI phase, and a TIN phase, a composite phase including an Al phase, an AlN phase, an REN phase, a TI phase, and a TIN phase, a composite phase including an Al phase, an RE phase, an REN phase, a TI phase, and a TIN phase, a composite phase including an AlN phase, an RE phase, an REN phase, a TI phase, and a TIN phase, or a composite phase including an Al phase, an AlN phase, an RE phase, an REN phase, a TI phase, and a TIN phase. Note that the valence is omitted from the notation.

In the present description, the term "metal phase" expresses a concept of a phase consisting of a single metal element.

In the present description, the term "nitride phase" expresses a concept of a phase consisting of a nitride.

[Fourth Structure-2]

An example of the form is a form in which the sputtering target according to the present embodiment has the fourth structure and the composite phase is a composite of an alloy phase and a metal phase, a form in which the sputtering target has the fourth structure and the composite phase is a composite of an alloy phase and a nitride phase, a form in which the sputtering target has the fourth structure and the composite phase is a composite of a nitride phase and a metal phase, a form in which the sputtering target has the fourth structure and the composite phase is a composite of a nitride phase and another nitride phase, or a form in which the sputtering target has the fourth structure and the composite phase is a composite of an alloy phase, a metal phase, and a nitride phase. Here, the term "metal phase" refers to a phase G, a phase H, or a phase I in a metal state without being nitrided or oxidized, the term "alloy phase" refers to a phase D, a phase E, or a phase F in an alloy state without being nitrided or oxidized, and the term "nitride phase" refers to a phase G, a phase H, a phase I, a phase D, a phase E, or a phase F that is nitrided. In some cases, one metal phase, one alloy phase, and one nitride phase are each present in the target, in some cases, two or more metal phases, two or more alloy phases, and two or more nitride phases are each present in the target, and in some cases, a combination of a plurality phases selected out of metal phases, alloy phases, and nitride phases is present in the target. An example of these forms is a form in which at least one of an alloy phase of a phase D or a nitride phase of a phase D incorporates at least one of a metal phase of a phase G, a nitride phase of a phase G, a metal phase of a phase H, a nitride phase of a phase H, a metal phase of a phase I, or a nitride phase of a phase I, a form in which at least one of an alloy phase of a phase E or a nitride phase of a phase E incorporates at least one of a metal phase of a phase G, a nitride phase of a phase G, a metal phase of a phase H, a nitride phase of a phase H, a metal phase of a phase I, or a nitride phase of a phase I, or a form in which at least one of an alloy phase of a phase F or a nitride phase of a phase F incorporates at least one of a metal phase of a phase G, a nitride phase of a phase G, a metal phase of a phase H, a nitride phase of a phase H, a metal phase of a phase I, or a nitride phase of a phase I.

In the present description, the term "alloy phase" expresses a concept of a phase consisting of an alloy.

[Fifth Structure-2]

An example of the form is a form in which the sputtering target according to the present embodiment has the fifth structure and the composite phase is a composite of an aluminum matrix and at least one metal phase, a form in which the sputtering target has the fifth structure and the composite phase is a composite of an aluminum matrix and at least one of an aluminum nitride phase, a nitride phase of a rare earth element, or a nitride phase of a titanium group element, or a form in which the sputtering target has the fifth structure and the composite phase is a composite of a metal phase and a nitride phase. Here, the phrase "at least one metal phase" means only a phase H, only a phase I, or both a phase H and a phase I. The phrase "the composite phase is a composite of an aluminum matrix and at least one of an aluminum nitride phase, a nitride phase of a rare earth element, or a nitride phase of a titanium group element" means that the composite phase is, for example, a composite phase including an Al matrix and an REN phase, a composite phase including an Al matrix and a TIN phase, a composite phase including an Al matrix, an AlN phase, and an REN phase, a composite phase including an Al matrix, an AlN phase, and a TIN phase, a composite phase including an Al matrix, an REN phase, and a TIN phase, or a composite phase including an Al matrix, an AlN phase, an REN phase, and a TIN phase. The phrase "the composite phase is a composite of a metal phase and a nitride phase" means that the composite phase is, for example, a composite phase including an Al matrix, an RE phase, and a TIN phase, a composite phase including an Al matrix, an REN phase, and a TI phase, a composite phase including an Al matrix, an AlN phase, an RE phase, and a TI phase, a composite phase including an Al matrix, an AlN phase, an REN phase, and a TI phase, a composite phase including an Al matrix, an AlN phase, an RE phase, and a TIN phase, a composite phase including an Al matrix, an RE phase, an REN phase, and a TI phase, a composite phase including an Al matrix, an RE phase, an REN phase, and a TIN phase, a composite phase including an Al matrix, an RE phase, a TI phase, and a TIN phase, a composite phase including an Al matrix, an REN phase, a TI phase, and a TIN phase, a composite phase including an Al matrix, an AlN phase, an RE phase, an REN phase, and a TI phase, a composite phase including an Al matrix, an AlN phase, an RE phase, an REN phase, and a TIN phase, a composite phase including an Al matrix, an AlN phase, an RE phase, a TI phase, and a TIN phase, a composite phase including an Al matrix, an AlN phase, an REN phase, a TI phase, and a TIN phase, a composite phase including an Al matrix, an RE phase, an REN phase, a TI phase, and a TIN phase, or a composite phase including an Al matrix, an AlN phase, an RE phase, an REN phase, a TI phase, and a TIN phase. Note that N means a nitrogen element, and for example, the term "AlN phase" means an aluminum nitride phase. The valence of a nitride is omitted from the notation.

Forms of the fifth structure-2 include a form in which the composite phase is a composite of nitride phases further including an aluminum nitride phase. That is, the composite phase in the fifth structure-2 is a composite phase obtained by adding an AlN phase to each form example listed for the fifth structure. Specifically, the present embodiment includes a fifth structure-2 particularly in a case (1) in which the phrase "the composite phase is a composite of an aluminum matrix and at least one of an aluminum nitride phase, a nitride phase of a rare earth element, or a nitride phase of a titanium group element" means that the composite phase is a composite phase including an Al matrix, an AlN phase, and an REN phase, a composite phase including an Al matrix, an AlN phase, and a TIN phase, or a composite phase including an Al matrix, an AlN phase, an REN phase, and a TIN phase and in a case (2) in which the phrase "the composite phase is a composite of a metal phase and a nitride phase" means that the composite phase is a composite phase including an Al matrix, an AlN phase, an RE phase, and a TI phase, a composite phase including an Al matrix, an AlN phase, an REN phase, and a TI phase, a composite phase including an Al matrix, an AlN phase, an RE phase, and a TIN phase, a composite phase including an Al matrix, an AlN phase, an RE phase, an REN phase, and a TI phase, a composite phase including an Al matrix, an AlN phase, an RE phase, an REN phase, and a TIN phase, a composite phase including an Al matrix, an AlN phase, an RE phase, a TI phase, and a TIN phase, a composite phase including an Al matrix, an AlN phase, an REN phase, a TI phase, and a TIN phase, or a composite phase including an Al matrix, an AlN phase, an RE phase, an REN phase, a TI phase, and a TIN phase.

In the sputtering target according to the present embodiment, an intermetallic compound including at least two elements selected from aluminum, a rare earth element, or a titanium group element is preferably present in the sputtering target. For example, in the first structure or the second structure, such an intermetallic compound is present in the sputtering target. In a case where an alloy phase is present in the fourth structure, an intermetallic compound is present in the alloy phase. The variation in composition can be suppressed by reducing the number of sites of single aluminum, a single rare earth element, and a single titanium group element. In a case where the target includes a combination of single metals, a homogeneous film is difficult to obtain because the sputtering rates of the single metals are each applied to the sputtering to cause a remarkable variation, but by the intermetallic compound present in the target, the difference in sputtering rate between the metal elements is lessened, and thus the composition unevenness in the obtained film is reduced.

In the sputtering target according to the present embodiment, the intermetallic compound may include one, two, three, or four kinds of intermetallic compounds being present in the sputtering target. For example, in a case where an alloy phase is present in the first structure, the second structure, or the fourth structure, one, two, three, or four kinds of the intermetallic compounds are present in the sputtering target according to the number of kinds of metal species. In a case where the target includes a combination of single metals, a homogeneous film is difficult to obtain because the sputtering rates of the single metals are each applied to the sputtering to cause a remarkable variation, but by the presence of one or more intermetallic compounds, the difference in sputtering rate between the metal elements is further lessened, and thus the composition unevenness in the obtained film is further reduced.

In the sputtering target according to the present embodiment, at least one nitride of at least one element selected from aluminum, a rare earth element, or a titanium group element may be present in the sputtering target. When a nitride film of a piezoelectric element is formed, the piezoelectric element can withstand a high temperature and can have a high Q factor. For example, in all of the first structure to fifth structure, a nitrogen element is introduced, and thus a nitride is present. The number of kinds of present nitrides is one, two, three, four, or more according to the number of kinds of metal species.

In the sputtering target according to the present embodiment, the rare earth element is preferably at least one of scandium or yttrium. When a nitride film of a piezoelectric element is formed, the piezoelectric element can withstand a high temperature and can have a high Q factor. The rare earth element is single scandium, single yttrium, or a combination of scandium and yttrium. In a case where both scandium and yttrium are contained as a rare earth element, an example of the form is a form in which an Al—Sc—Y material or an Al—Sc—Y phase is present, a form in which at least two of an Al—Sc material, an Al—Y material, or an Al—Sc—Y material are simultaneously present, or a form in which at least two of an Al—Sc phase, an Al—Y phase, or an Al—Sc—Y phase are simultaneously present.

In the sputtering target according to the present embodiment, the titanium group element is preferably at least one of titanium, zirconium, or hafnium. When a nitride film of a piezoelectric element is formed, the piezoelectric element can withstand a high temperature and can have a high Q factor. Examples of the titanium group element include single titanium, single zirconium, single hafnium, a combination of titanium and zirconium, a combination of titanium and hafnium, a combination of zirconium and hafnium, and a combination of titanium, zirconium, and hafnium. In a case where, for example, both titanium and zirconium are contained as a titanium group element, an example of the form is a form in which an Al—Ti—Zr material or an Al—Ti—Zr phase is present, a form in which at least two of an Al—Ti material, an Al—Zr material, or an Al—Ti—Zr material are simultaneously present, or a form in which at least two of an Al—Ti phase, an Al—Zr phase, or an Al—Ti—Zr phase are simultaneously present. In a case where both titanium and hafnium are contained, an example of the form is a form in which an Al—Ti—Hf material or an Al—Ti—Hf phase is present, a form in which at least two of an Al—Ti material, an Al—Hf material, or an Al—Ti—Hf material are simultaneously present, or a form in which at least two of an Al—Ti phase, an Al—Hf phase, or an Al—Ti—Hf phase are simultaneously present. In a case where both zirconium and hafnium are contained, an example of the form is a form in which an Al—Zr—Hf material or an Al—Zr—Hf phase is present, a form in which at least two of an Al—Zr material, an Al—Hf material, or an Al—Zr—Hf material are simultaneously present, or a form in which at least two of an Al—Zr phase, an Al—Hf phase, or an Al—Zr—Hf phase are simultaneously present. In a case where titanium, zirconium, and hafnium are contained, an example of the form is a form in which an Al—Ti—Zr—Hf material or an Al—Ti—Zr—Hf phase is present, a form in which at least two of an Al—Ti material, an Al—Zr material, an Al—Hf material, an Al—Ti—Zr material, an Al—Ti—Hf material, an Al—Zr—Hf material, or an Al—Ti—Zr—Hf material are simultaneously present, a form in which at least two of an Al—Ti phase, an Al—Zr phase, an Al—Hf phase, an Al—Ti—Zr phase, an Al—Ti—Hf phase, an Al—Zr—Hf phase, or an Al—Ti—Zr—Hf phase are simultaneously present, a form in which a material or a phase containing Al and any two of Ti, Zr, and Hf is further added to a form described above, or a form in which a material or a phase containing Al and any one of Ti, Zr, and Hf is further added to a form described above.

In the sputtering target according to the present embodiment, an oxygen content is preferably 500 ppm or less, more preferably 300 ppm or less, and still more preferably 100 ppm or less. In the sputtering target, formation of a strongly bound compound is suppressed, and in forming a thin film using the sputtering target, the formed thin film can have good orientation. Furthermore, reduction in the electrical conductivity is suppressed, and the formed thin film can have a good yield while generation of particles is suppressed. For example, aluminum or the like may be nitrided in a nitrogen-containing atmosphere in film formation of the sputtering target, however if the oxygen content is more than 500 ppm, once the sputtering target contains a large amount of oxygen, aluminum or the like is not nitrided and is preferentially bonded to oxygen to form a thin film that partially includes a strongly bound compound having a lattice having a large molecular size, and as a result, large distortion is generated in the formed thin film and thus the orientation of the thin film deteriorates, so that the oxygen content in the sputtering target is preferably adjusted to 500 ppm or less.

In the sputtering target according to the present embodiment, a chlorine content is preferably 100 ppm or less, more preferably 50 ppm or less, and still more preferably 30 ppm or less. For example, aluminum or the like may be nitrided in a nitrogen-containing atmosphere in film formation of the sputtering target, however if the chlorine content is more than 100 ppm, once the sputtering target contains a large amount of chlorine, aluminum or the like is not nitrided and is preferentially bonded to chlorine to form a thin film that partially includes a strongly bound compound having a lattice having a large molecular size, and as a result, large distortion is generated in the formed thin film and thus the orientation of the thin film deteriorates, so that the chlorine content in the sputtering target is preferably adjusted to 100 ppm or less.

In the sputtering target according to the present embodiment, a fluorine content is preferably 100 ppm or less, more preferably 50 ppm or less, and still more preferably 30 ppm or less. For example, aluminum or the like may be nitrided in a nitrogen-containing atmosphere in film formation of the sputtering target, however if the fluorine content is more than 100 ppm, once the sputtering target contains a large amount of fluorine, aluminum or the like is not nitrided and is preferentially bonded to fluorine to form a thin film that partially includes a strongly bound compound having a lattice having a large molecular size, and as a result, large distortion is generated in the formed thin film and thus the orientation of the thin film deteriorates, so that the fluorine content in the sputtering target is preferably adjusted to 100 ppm or less.

In the sputtering target according to the present embodiment, a carbon content is preferably 200 ppm or less, more preferably 100 ppm or less, and still more preferably 50 ppm or less. If the carbon content is more than 200 ppm, carbon is incorporated into a film during sputtering, and a thin film having poor crystallinity is formed. Furthermore, if a strongly bound compound is formed on the surface of the target, the conductivity is impaired, particles are generated due to abnormal discharge, and the yield of the film deteriorates, so that the carbon content in the sputtering target is preferably adjusted to 200 ppm or less.

In the sputtering target according to the present embodiment, a silicon content is preferably 200 ppm or less, more preferably 100 ppm or less, and still more preferably 50 ppm or less. If the silicon content is more than 200 ppm, an oxide or nitride of silicon is formed during sputtering, abnormal discharge occurs from the oxide or nitride as a starting point, particles are generated, and the yield of the formed thin film deteriorates, so that the silicon content in the sputtering target is preferably adjusted to 200 ppm or less.

In the sputtering target according to the present embodiment, examples of the rare earth element contained in addition to aluminum include scandium and yttrium, and examples of the titanium group element contained in addition to aluminum include titanium, zirconium, and hafnium. The scandium content in the target is preferably 5 to 75 atom %. The scandium content is more preferably 10 to 50 atom %. The yttrium content in the target is preferably 5 to 75 atom %. The yttrium content is more preferably 10 to 50 atom %. The titanium content in the target is preferably 5 to 75 atom %. The titanium content is more preferably 10 to 50 atom %. The zirconium content in the target is preferably 5 to 75 atom %. The zirconium content is more preferably 10 to 50 atom %. The hafnium content in the target is preferably 5 to 75 atom %. The hafnium content is more preferably 10 to 50 atom %. The sputtering target according to the present embodiment includes aluminum and at least one of the above-described elements at a content satisfying the above-described range.

The sputtering target according to the present embodiment encompasses a sputtering target having a composition such that the equilibrium diagram shows no Al phase deposition. Examples of a binary alloy having such a composition include an Al—Sc alloy including 25 atom % or more and 67 atom % or less of Sc, an Al—Y alloy including 25 atom % or more and 67 atom % or less of Y, an Al—Hf alloy including 25 atom % or more and 67 atom % or less of Hf, an Al—Zr alloy including 25 atom % or more and 75 atom % or less of Zr, and an Al—Ti alloy including 25 atom % or more and 78 atom % or less of Ti. The sputtering target according to the present embodiment has an aluminum matrix in the structure even if the sputtering target has a composition such that the equilibrium diagram shows no Al phase deposition.

In the case of forming an alloy containing a rare earth element and a titanium group element in addition to aluminum, first, an aluminum-rare earth element alloy such as an aluminum-scandium alloy or an aluminum-yttrium alloy is formed in the above-described composition range. Next, an aluminum-titanium group element alloy such as an aluminum-titanium alloy, an aluminum-zirconium alloy, or an aluminum-hafnium alloy is formed in the above-described composition range. Then, the aluminum-rare earth element alloy and the aluminum-titanium group element alloy are mixed while the content of each alloy is adjusted to form an aluminum-rare earth element-titanium group element alloy. An aluminum-rare earth element-titanium group element alloy may be directly formed without forming a ternary alloy by mixing binary alloys as described above. By forming an intermetallic compound in the sputtering target and forming a nitride film during sputtering, it is possible to form a piezoelectric film capable of having a high Q factor even at a high temperature.

A method for manufacturing the sputtering target according to the present embodiment will be described. A method for manufacturing the sputtering target includes: a first step of manufacturing an aluminum raw material to be mainly a matrix and, as a raw material to be mainly a material or phase present in the matrix, (1) a raw material including aluminum and a rare earth element, (2) a raw material including aluminum and a titanium group element, or (3) a raw material including aluminum, a rare earth element, and a titanium group element; a second step of manufacturing an aluminum powder to be mainly the matrix and, as an alloy powder to be mainly the material or phase present in the matrix, (1) an alloy powder of aluminum and the rare earth element (aluminum-rare earth element), (2) an alloy powder of aluminum and the titanium group element (aluminum-titanium group element), or (3) an alloy powder of aluminum, the rare earth element, and the titanium group element (aluminum-rare earth element-titanium group element) from the raw materials manufactured in the first step; and a third step of obtaining (1) a sintered body of aluminum and aluminum-rare earth element, (2) a sintered body of aluminum and aluminum-titanium group element, or (3) a sintered body of aluminum and aluminum-rare earth element-titanium group element from the powders obtained in the second step.

First Step

This step is a step of producing a raw material used in manufacturing an aluminum powder, an aluminum-rare earth element alloy powder, an aluminum-titanium group element alloy powder, or an aluminum-rare earth element-titanium group element alloy powder in the second step. Examples of the form of the raw material produced in the first step to manufacture a powder (hereinafter, also simply referred to as a "raw material") include (1A) a form in which a single metal of each constituent element of an alloy target is prepared as a starting material, and the prepared single metals are mixed to obtain a raw material, (2A) a form in which an alloy having the same composition as an alloy target is prepared as a starting material and used as a raw material, and (3A) a form in which after preparing, as starting materials, alloy including the same constituent elements as an alloy target or including constituent elements lacking partially to have a composition ratio different from a desired composition ratio, and a single metal to be blended for adjustment to the desired composition, the alloy and the single metal are mixed to obtain a raw material. As a starting material, any one of aluminum, a combination of aluminum and a rare earth element, a combination of aluminum and a titanium group element, and a combination of aluminum, a rare earth element, and a titanium group element is charged into a melting device and melted to produce a raw material including aluminum, a raw material including an aluminum-rare earth element alloy, a raw material including an aluminum-titanium group element alloy, or a raw material including an aluminum-rare earth element-titanium group element alloy. In regard to a material of a device or a container used in the melting device, a material containing an impurity only in a small amount is preferably used so that the raw material including aluminum, the raw material including an aluminum-rare earth element alloy, the raw material including an aluminum-titanium group element alloy, or the raw material including an aluminum-rare earth element-titanium group element alloy is not contaminated with a large amount of impurity after the melting. In regard to a melting method, a method is selected which is applicable to the following melting temperature. The melting temperature is a temperature of 700 to 900° C. at which aluminum is heated, a temperature of 1,300 to 1,800° C. at which an aluminum-rare earth element alloy is heated, a temperature of 1,300 to 1,800° C. at which an aluminum-titanium group element alloy is heated, or a temperature of 1,300 to 1,800° C. at which an aluminum-rare earth element-titanium group element alloy is heated. The atmosphere in the melting device is a vacuum atmosphere having a degree of vacuum of $1\times10^{-2}$ Pa or less, a nitrogen gas atmosphere containing a hydrogen gas at a content of 4 vol % or less, an inert gas atmosphere containing a hydrogen gas at a content of 4 vol % or less, or the like.

The raw material of an alloy powder has one of the three raw material forms described in (1A), (2A), and (3A) above, and in addition, may have a form of an alloy grain, an alloy lump, or a combination of a powder, a grain, and a lump. The terms "powder", "grain", and "lump" are used to express the difference in size between the raw materials, but the size of each raw material is not particularly limited as long as the raw material can be used in a powder manufacturing device in the second step. Specifically, the size of each raw material is not particularly limited as long as the raw material can be supplied to the powder manufacturing device because the raw material is melted in the powder manufacturing device in the second step.

Second Step

This step is a step of manufacturing an aluminum powder, an aluminum-rare earth element alloy powder, an aluminum-titanium group element alloy powder, or an aluminum-rare earth element-titanium group element alloy powder. At least one of the raw material including aluminum, the raw material including an aluminum-rare earth element alloy, the raw material including an aluminum-titanium group element alloy, or the raw material including an aluminum-rare earth element-titanium group element alloy manufactured in the first step is charged into a powder manufacturing device and melted to obtain a molten metal, and then the molten metal is sprayed with a gas, water, or the like and thus scattered and rapidly solidified to produce a powder. In regard to a material of a device or a container used in the powder manufacturing device, a material containing an impurity only in a small amount is preferably used so that the aluminum powder, the aluminum-rare earth element alloy powder, the aluminum-titanium group element alloy powder, or the aluminum-rare earth element-titanium group element alloy powder is not contaminated with a large amount of impurity after the melting. In regard to a melting method, a method is selected which is applicable to the following melting temperatures. The melting temperatures are a temperature of 700 to 900° C. at which the raw material including aluminum is heated, a temperature of 1,300 to 1,800° C. at which the raw material including an aluminum-rare earth element alloy is heated, a temperature of 1,300 to 1,800° C. at which the raw material including an aluminum-titanium group element alloy is heated, and a temperature of 1,300 to 1,800° C. at which the raw material including an aluminum-rare earth element-titanium group element alloy is heated. The atmosphere in the powder manufacturing device is a vacuum atmosphere having a degree of vacuum of $1\times10^{-2}$ Pa or less, a nitrogen gas atmosphere containing a hydrogen gas at a content of 4 vol % or less, an inert gas atmosphere containing a hydrogen gas at a content of 4 vol % or less, or the like. The molten metal in spraying preferably has a temperature of "the melting point of aluminum, the aluminum-rare earth element alloy, the aluminum-titanium group element alloy, or the aluminum-rare earth element-titanium group element alloy +100° C. or more", and more preferably a temperature of "the melting point of aluminum, the aluminum-rare earth element alloy, the aluminum-titanium group element alloy, or the aluminum-rare earth element-titanium group element alloy +150 to 250° C.". This is because if the temperature is too high, the molten metal is not sufficiently cooled during granulation and is less likely to be formed into a powder, and the production efficiency is not good. If the temperature is too low, a problem is likely to occur that the nozzle is easily clogged during spraying. The gas used for spraying is nitrogen, argon, or the like, but is not limited to these gases. In the case of the alloy powder, deposition of the intermetallic compound of the alloy powder is more suppressed, than in the melting method, by rapid solidification to reduce the size of the deposited particle corresponding to an island in the sea-island structure in some cases, and this state is already obtained at the stage of the alloy powder and is maintained even after sintering or even when a target is formed. The element ratio in the rapidly cooled powder is the element ratio between aluminum and the rare earth element, aluminum and the titanium group element, or aluminum, the rare earth element, and the titanium group element prepared in the first step.

Third Step

This step is a step of obtaining a sintered body to be a target from the powder obtained in the second step. The sintering is performed with a hot press method (hereinafter, also referred to as HP), a spark plasma sintering method (hereinafter, also referred to as SPS), or a hot isostatic pressing method (hereinafter, also referred to as HIP). The aluminum powder, the aluminum-rare earth element alloy powder, the aluminum-titanium group element alloy powder, or the aluminum-rare earth element-titanium group element alloy powder obtained in the second step is used for sintering. The powders are used for sintering as in the following cases.

(1B) In a case where the aluminum-rare earth element alloy is to be present in the aluminum matrix, a mixed powder obtained by mixing the aluminum powder and the aluminum-rare earth element alloy powder is used.

(2B) In a case where the aluminum-titanium group element alloy is to be present in the aluminum matrix, a mixed powder obtained by mixing the aluminum powder and the aluminum-titanium group element alloy powder is used.

(3B) In a case where the aluminum-rare earth element-titanium group element alloy is to be present in the aluminum matrix, for example, a mixed powder obtained by mixing the aluminum powder and the aluminum-rare earth element-titanium group element alloy powder is used, or a mixed powder obtained by mixing the aluminum powder, the aluminum-rare earth element alloy powder, and the aluminum-titanium group element alloy powder is used.

It is preferable that any one of the powders shown in (1B) to (3B) above be filled into a mold, enclosed in the mold and a punch or the like under preliminary pressurization at 10 to 30 MPa, and then sintered. At this time, the sintering temperature is preferably 500 to 600° C., and the pressure is preferably 40 to 196 MPa. The atmosphere in the sintering device is a vacuum atmosphere having a degree of vacuum of $1\times10^{-2}$ Pa or less, a nitrogen gas atmosphere containing a hydrogen gas at a content of 4 vol % or less, an inert gas atmosphere containing a hydrogen gas at a content of 4 vol % or less, or the like. The hydrogen gas is preferably contained at a content of 0.1 vol % or more. The holding time (holding time at the maximum sintering temperature) is preferably 2 hours or less and more preferably 1 hour or less, and still more preferably, there is no holding time.

By performing at least the first step to the third step, composition deviation can be suppressed in the in-plane direction and the thickness direction of the sputtering target, and the produced sputtering target can contain an impurity, only in a small amount, that affects thin film formation. Furthermore, the produced sputtering target can contain chlorine only in a small amount.

If the sintered body obtained through the first step to the third step is used as a sputtering target, the obtained sputtering target has an aluminum matrix in the structure even if the sputtering target has a composition such that the equilibrium diagram shows no Al phase deposition.

Methods for manufacturing the sputtering target according to the present embodiment also includes a modified example as described below. That is, in the first step, as an aluminum raw material to be mainly a matrix and a raw material to be mainly a material or phase present in the matrix, (1) a rare earth element raw material, (2) a titanium group element raw material, or (3) a raw material including a rare earth element and a titanium group element may be manufactured. In the second step, the raw materials manufactured in the first step may be each formed into an atomized powder. In the third step, (1) a sintered body of aluminum and a rare earth element, (2) a sintered body of aluminum and a titanium group element, or (3) a sintered body of aluminum and rare earth element-titanium group element is obtained from the raw material obtained in the first step or the powder obtained in the second step.

In the present embodiment, examples of the method of composition analysis under (Condition 1) and (Condition 2) include energy dispersive X-ray spectroscopy (EDS), high frequency inductively coupled plasma atomic emission spectroscopy (ICP), and X-ray fluorescence analysis (XRF), and composition analysis by EDS is preferable.

EXAMPLES

Hereinafter, the present disclosure will be described in more detail with reference to Examples, but the present disclosure is not construed as being limited to Examples.

Example 1

Figure 7:
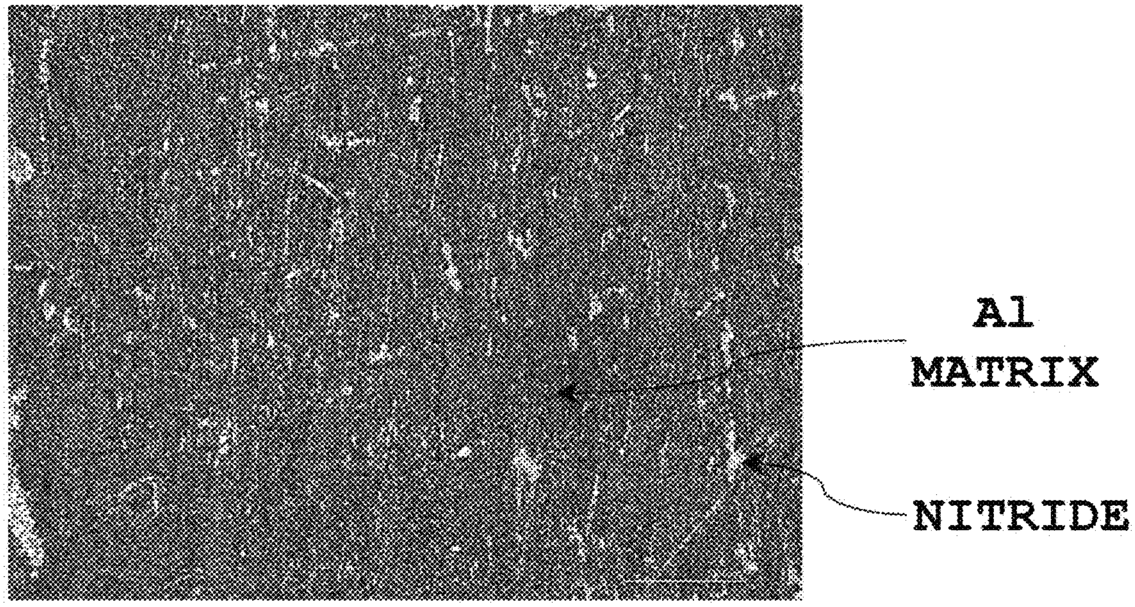
FIG. 7 is an image obtained by observing a surface of an Al—ScN target in Example 1 with a microscope.

A pure Al powder having a particle size of 150 μm or less and a purity of 4N and a ScN powder having a particle size of 150 μm or less and a purity of 3N were used, and after the amount of each powder was adjusted so that an Al-10 mol % ScN was obtained, the powders were mixed. Then, the Al-10 mol % ScN mixed powder was filled into a carbon mold for spark plasma sintering (hereinafter, also referred to as SPS sintering). Next, the mixed powder was enclosed in the mold and a punch or the like under preliminary pressurization at 10 MPa, and the mold filled with the mixed powder was set in an SPS device (model number: SPS-825, manufactured by SPS SYNTEX INC.). Then, sintering was performed under the sintering conditions of a sintering temperature of 550° C., a pressure of 30 MPa, a vacuum atmosphere at $8\times10^{-3}$ Pa or less as the atmosphere in a sintering device, and a holding time of a maximum sintering temperature of 0 hour. The Al-10 mol % ScN sintered body after the sintering was processed using a grinding machine, a lathe, or the like to produce an Al-10 mol % ScN target having a size of Φ50 mm×6 mmt. In producing the target, the workability was good, and molding into the target shape was possible. The target included two kinds of phases of Al and ScN, and had the fifth structure-2. The conductivity of the surface of the produced target was measured using a contact-type four-point probe resistivity meter. The conductivity was $4.079\times10^{-5}\Omega/\square$, and it was confirmed that the conductivity allowing DC sputtering was ensured. The surface of the produced target was observed with a microscope. FIG. 7 shows the observed image. The image in FIG. 7 has a lateral side length of 650 μm. From FIG. 7, it can be confirmed that Al occupies the most part as compared with ScN, and from the value of the conductivity, it is considered that Al is continuously present to ensure the conductivity and that an aluminum matrix is present on the basis of the continuously present Al, and as a result, it is considered that the workability during producing the target was obtained. The content rates of ScN at S1 to S9 in FIG. 1 and the content rates of ScN at C1 to C9 in FIG. 2 were measured using energy dispersive X-ray spectroscopy (EDS) (manufactured by JEOL Ltd.). The measurement range was 0.5 mm×0.5 mm. Tables 1 and 2 show the measurement results.

TABLE 1

| In-plane direction of sputter surface | | | | | | | | | | |
|---|---|---|---|---|---|---|---|---|---|---|
| Measurement point | S1 | S2 | S3 | S4 | S5 | S6 | S7 | S8 | S9 | Average of measured values at S1 to S9: 10.20 |
| Measured value | 10.04 | 10.76 | 9.63 | 9.88 | 10.18 | 10.73 | 9.24 | 10.82 | 10.55 | |
| Difference from average of measured values at S1 to S9 | 0.16 | −0.56 | 0.57 | 0.32 | 0.02 | −0.53 | 0.96 | −0.62 | −0.35 | |

TABLE 1-continued

| Target thickness direction | | | | | | | | | | |
|---|---|---|---|---|---|---|---|---|---|---|
| Measurement point | C1 | C2 | C3 | C4 | C5 | C6 | C7 | C8 | C9 | Average of |
| Measured value | 10.52 | 10.28 | 9.91 | 9.07 | 9.25 | 9.86 | 10.52 | 10.73 | 10.35 | measured values |
| Difference from average of measured values at C1 to C9 | −0.46 | −0.22 | 0.15 | 0.99 | 0.81 | 0.20 | −0.46 | −0.67 | −0.29 | at C1 to C9: 10.06 |

Unit: atomic percentage (at. %)

TABLE 2

| In-plane direction of sputter surface | | | | | | | | | | Average of |
|---|---|---|---|---|---|---|---|---|---|---|
| Measurement point | S1 | S2 | S3 | S4 | S5 | S6 | S7 | S8 | S9 | measured values |
| Measured value | 10.04 | 10.76 | 9.63 | 9.88 | 10.18 | 10.73 | 9.24 | 10.82 | 10.55 | at 18 points of |
| Difference from average | 0.09 | −0.63 | 0.50 | 0.25 | −0.05 | −0.60 | 0.89 | −0.69 | −0.42 | S1 to S9 |
| Target thickness direction | | | | | | | | | | and C1 to C9: |
| Measurement point | C1 | C2 | C3 | C4 | C5 | C6 | C7 | C8 | C9 | 10.13 |
| Measured value | 10.52 | 10.28 | 9.91 | 9.07 | 9.25 | 9.86 | 10.52 | 10.73 | 10.35 | |
| Difference from average | −0.39 | −0.15 | 0.22 | 1.06 | 0.88 | 0.27 | −0.39 | −0.60 | −0.22 | |

Unit: atomic percentage (at. %)

From the results in Table 1, the average of the content rates of ScN at S1 to S9 was 10.20%, and the difference between the content rate of ScN, at each of S1 to S9, and the average of the content rates of ScN at S1 to S9 was 0.96 at the maximum and 0.02 at the minimum. Furthermore, the average of the content rates of ScN at C1 to C9 was 10.06%, and the difference between the content rate of ScN, at each of C1 to C9, and the average of the content rates of ScN at C1 to C9 was 0.99 at the maximum and 0.15 at the minimum. From the results in Table 2, the average of the content rates of ScN at S1 to S9 and C1 to C9 was 10.13%, and the difference between the content rate of ScN, at each of S1 to S9 and C1 to C9, and the average of the content rates of ScN at S1 to S9 and C1 to C9 was 1.06 at the maximum and 0.05 at the minimum.

Non Patent Literature 1 shows that in a nitride film, a change in the Sc concentration causes a rapid change in the piezoelectric characteristic. In the target obtained in the present disclosure, the composition deviation at each point is small, that is, the composition deviation depending on the location in the target is small in the in-plane direction and in the thickness direction, and with the target, an intended nitride film can be formed in which the variation in the Sc concentration is small, resulting in a desired piezoelectric characteristic exhibited by the formed nitride film.

Example 2

Figure 8:
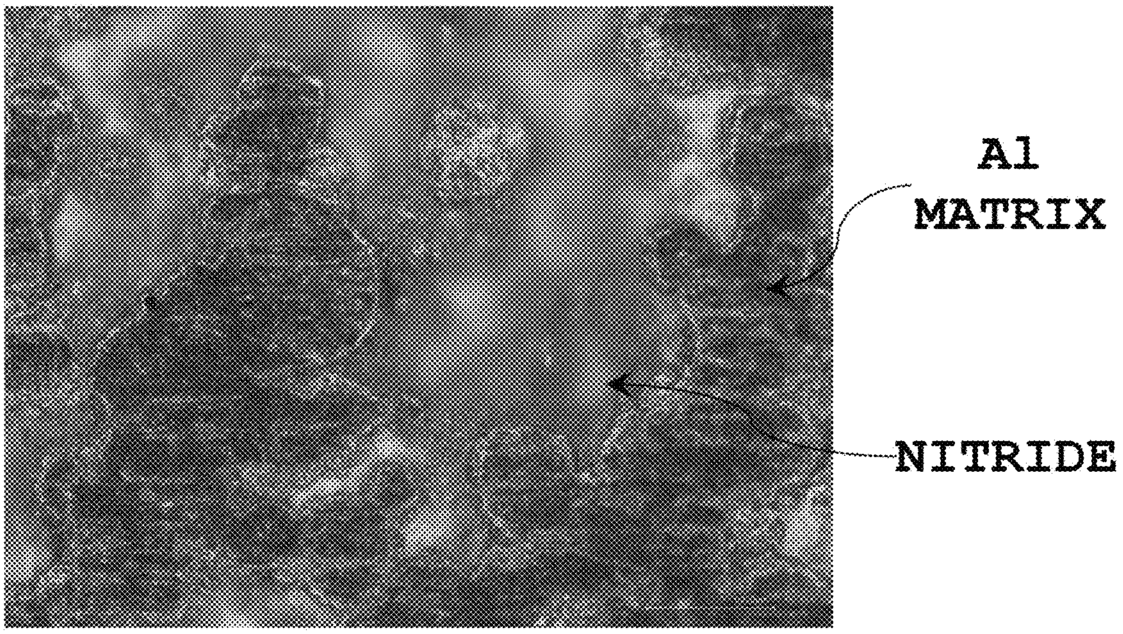
FIG. 8 is an image obtained by observing a surface of an Al—ScN target in Example 2 with a microscope.

An Al-50 mol % ScN target was produced in the same manner as in Example 1 except that Al-10 mol % ScN was changed to Al-50 mol % ScN. During producing the target, the workability was good, and molding into the target shape was possible. The target included two kinds of phases of Al and ScN, and had the fifth structure-2. The conductivity of the surface of the produced target was measured using a contact-type four-point probe resistivity meter. The conductivity was $2.130\times10^{-3}\Omega/\square$, and it was confirmed that the conductivity allowing DC sputtering was ensured. The surface of the produced target was observed with a microscope. FIG. 8 shows the observed image. The image in FIG. 8 has a lateral side length of 650 μm. From FIG. 8, it can be confirmed that ScN and Al are present at a similar proportion, and from the value of the conductivity, it is considered that Al is continuously present to ensure the conductivity and that an aluminum matrix is present on the basis of the continuously present Al, and as a result, it is considered that the workability during producing the target was obtained.

Example 3

An Al raw material having a purity of 4N and a Sc raw material having a purity of 3N were charged into a powder manufacturing device, and next, the inside of the powder manufacturing device was adjusted to a vacuum atmosphere at $5\times10^{-5}$ Pa or less, the Al raw material and the Sc raw material were melted at a melting temperature of 1,700° C. to obtain a molten metal, and next, the molten metal was sprayed with an argon gas and thus scattered and rapidly solidified to produce an $Al_3Sc$ powder having a particle size of 150 μm or less. Then, a pure Al powder having a particle size of 150 μm or less and a purity of 4N and the $Al_3Sc$ powder having a particle size of 150 μm or less were used, and after the amount of each powder was adjusted so that an Al-14.29 mol % $Al_3Sc$ mixed powder was obtained, the powders were mixed. Then, the Al-14.29 mol % $Al_3Sc$ mixed powder was sintered under the same sintering conditions as in Example 1. The Al-14.29 mol % $Al_3Sc$ sintered body was processed using a grinding machine, a lathe, or the like to produce an Al-14.29 mol % $Al_3Sc$ target having a size of Φ50 mm×6 mmt. During producing the target, the workability was good, and molding into the target shape was possible. The target included two kinds of phases of Al and $Al_3Sc$, and had the second structure. The conductivity of the surface of the produced target was measured using a contact-type four-point probe resistivity meter. The conductivity was $5.438\times10^{-5}\Omega/\square$, and it was confirmed that the conductivity allowing DC sputtering was ensured. From the value of the conductivity, it is considered that Al is continuously present to ensure the conductivity and that an aluminum matrix is present on the basis of the continuously present Al, and as a result, it is considered that the workability during producing the target was obtained.

In Example 3, the oxygen content was measured using a mass spectrometer (model number: ON836, manufactured by LECO Corporation). The oxygen content was 452 ppm.

Example 4

An Al-50 mol % $Al_3Sc$ target was produced in the same manner as in Example 3 except that Al-14.29 mol % $Al_3Sc$ was changed to Al-50 mol % $Al_3Sc$. During producing the target, the workability was good, and molding into the target shape was possible. The target included two kinds of phases of Al and $Al_3Sc$, and had the second structure. The conductivity of the surface of the produced target was measured using a contact-type four-point probe resistivity meter. The conductivity was pb $8.611\times10^{-5}\Omega/\square$, and it was confirmed that the conductivity allowing DC sputtering was ensured. From the value of the conductivity, it is considered that Al is continuously present to ensure the conductivity and that an aluminum matrix is present on the basis of the continuously present Al, and as a result, it is considered that the workability during producing the target was obtained.

Comparative Example 1

Figure 9:
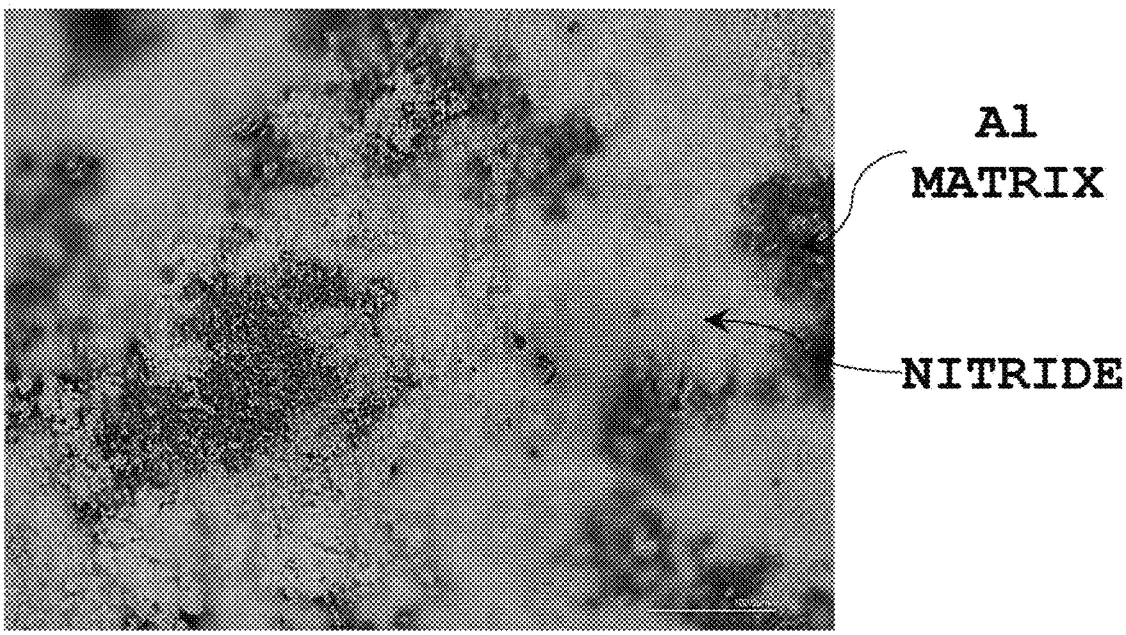
FIG. 9 is an image obtained by observing a surface of an Al—ScN target in Comparative Example 1 with a microscope.

An attempt was made to produce an Al-80 mol % ScN target in the same manner as in Example 1 except that Al-10 mol % ScN was changed to Al-80 mol % ScN. However, a defect such as a crack occurred during processing. The conductivity of the fragment surface of the cracked target was measured using a contact-type four-point probe resistivity meter, but the value of the conductivity was undetectable, and thus it was confirmed that the conductivity allowing DC sputtering was not ensured. The surface of the cracked target was observed with a microscope. FIG. 9 shows the observed image. The image in FIG. 9 has a lateral side length of 650 μm. From FIG. 9, it was confirmed that ScN occupied the most part as compared with Al. That is, in Comparative Example 1, the aluminum matrix was partially present in ScN. From the value of the conductivity, it is considered that the conductivity was not ensured because Al was not continuously present due to ScN, and from the fact that a large amount of ScN was present, it is considered that the workability during producing the target was not obtained. The image in FIG. 9 and the fact that the conductivity was not ensured confirm that the aluminum matrix was partially present in ScN.

Comparative Example 2

An Al-5 mol % ScN target was produced in the same manner as in Example 1 except that Al-10 mol % ScN was changed to Al-5 mol % ScN. During producing the target, the workability was good, and molding into the target shape was possible. However, the target has little content of nitride incorporated in an aluminum matrix, and therefore, when a nitride film to be used in a piezoelectric element or the like is formed by reactive sputtering with a flowing nitrogen gas, the required amount of the nitrogen gas is similar to that in reactive sputtering in which a conventional Al target or Al—Sc target is used.

Example 5

A pure Al powder having a particle size of 150 μm or less and a purity of 4N and a Ti powder having a particle size of 150 μm or less and a purity of 3N were used, and after the amount of each powder was adjusted so that an Al-20 atom % Ti mixed powder was obtained, the powders were mixed. Then, the Al-20 atom % Ti mixed powder was sintered under the same sintering conditions as in Example 1. The Al-20 atom % Ti sintered body was processed using a grinding machine, a lathe, or the like to produce an Al-20 atom % Ti target having a size of Φ50.8 mm×5 mmt. During producing the target, the workability was good, and molding into the target shape was possible. The target included two kinds of phases of Al and $Al_3Ti$, and had the second structure. The conductivity of the surface of the produced target was measured using a contact-type four-point probe resistivity meter. The conductivity was $4.250\times10^{-5}\Omega/\square$, and it was confirmed that the conductivity allowing DC sputtering was ensured. From the value of the conductivity, it is considered that Al is continuously present to ensure the conductivity and that an aluminum matrix is present on the basis of the continuously present Al, and as a result, it is considered that the workability during producing the target was obtained.

The content rates of Ti at S1 to S9 in FIG. 1 and the content rates of Ti at C1 to C9 in FIG. 2 were measured using EDS (manufactured by JEOL Ltd.). The measurement range was 0.5 mm×0.5 mm. Tables 3 and 4 show the measurement results.

TABLE 3

| In-plane direction of sputter surface | | | | | | | | | | |
|---|---|---|---|---|---|---|---|---|---|---|
| Measurement point | S1 | S2 | S3 | S4 | S5 | S6 | S7 | S8 | S9 | Average of measured values at S1 to S9: 19.47 |
| Measured value | 18.13 | 19.99 | 20.08 | 21.03 | 18.98 | 18.25 | 20.21 | 18.81 | 19.74 | |
| Difference from average of measured values at S1 to S9 | 1.34 | −0.52 | −0.61 | −1.56 | 0.49 | 1.22 | −0.74 | 0.66 | −0.27 | |
| **Target thickness direction** | | | | | | | | | | |
| Measurement point | C1 | C2 | C3 | C4 | C5 | C6 | C7 | C8 | C9 | Average of measured values at C1 to C9: 20.53 |
| Measured value | 20.64 | 20.72 | 19.68 | 20.44 | 20.57 | 21.00 | 20.01 | 21.10 | 20.59 | |
| Difference from average of measured values at C1 to C9 | −0.11 | −0.19 | 0.85 | 0.09 | 0.04 | −0.47 | 0.52 | −0.57 | −0.06 | |

Unit: atomic percentage (at. %)

TABLE 4

| | In-plane direction of sputter surface | | | | | | | | | Average of |
|---|---|---|---|---|---|---|---|---|---|---|
| Measurement point | S1 | S2 | S3 | S4 | S5 | S6 | S7 | S8 | S9 | measured values |
| Measured value | 18.13 | 19.99 | 20.08 | 21.03 | 18.98 | 18.25 | 20.21 | 18.81 | 19.74 | at 18 points of |
| Difference from average | 1.89 | 0.01 | −0.08 | −1.03 | 1.02 | 1.75 | −0.21 | 1.19 | 0.26 | S1 to S9 |
| | Target thickness direction | | | | | | | | | and C1 to C9: |
| Measurement point | C1 | C2 | C3 | C4 | C5 | C6 | C7 | C8 | C9 | 20.00 |
| Measured value | 20.64 | 20.72 | 19.68 | 20.44 | 20.57 | 21.00 | 20.01 | 21.10 | 20.59 | |
| Difference from average | −0.64 | −0.72 | 0.32 | −0.44 | −0.57 | −1.00 | −0.01 | −1.10 | −0.59 | |

Unit: atomic percentage (at. %)

From the results in Table 3, the average of the content rates of Ti at S1 to S9 was 19.47%, and the difference between the content rate of Ti, at each of S1 to S9, and the average of the content rates of Ti at S1 to S9 was 1.56 at the maximum and 0.27 at the minimum. Furthermore, the average of the content rates of Ti at C1 to C9 was 20.53%, and the difference between the content rate of Ti, at each of C1 to C9, and the average of the content rates of Ti at C1 to C9 was 0.85 at the maximum and 0.04 at the minimum. From the results in Table 4, the average of the content rates of Ti at S1 to S9 and C1 to C9 was 20.00%, and the difference between the content rate of Ti, at each of S1 to S9 and C1 to C9, and the average of the content rates of Ti at S1 to S9 and C1 to C9 was 1.87 at the maximum and 0.01 at the minimum. In the target obtained in the present disclosure, the composition deviation at each point is small, that is, the composition deviation depending on the location in the target is small in the in-plane direction and in the thickness direction. As a result, for example, by reactive sputtering in which nitrogen is supplied, an intended nitride film can be formed in which the variation in the Ti concentration is small, resulting in a desired piezoelectric characteristic exhibited by the formed nitride film.

REFERENCE SIGNS LIST

100, 200, 300, 400 Sputtering target
O Center
L, Q Imaginary crossing lines
S1 to S9 Measurement site in sputter surface
C1 to C9 Measurement site in cross section
P1 to P9 Measurement site in sputter surface
D1 to D9 Measurement site in cross section
1 Al-RE alloy particle
3 Al matrix
2, 2*a*, 2*b* Al-RE alloy crystal grain
4, 4*a*, 4*b* Aluminum crystal grain

What is claimed is:

1. A sputtering target comprising:

an aluminum matrix; and (1) a material or phase containing aluminum and further containing a rare earth element, at a content of 10 to 70 mol % in the aluminum matrix, or (2) a material or phase containing a rare earth element, at a content of 10 to 70 mol % in the aluminum matrix;

wherein an intermetallic compound including at least two elements selected from the group consisting of aluminum, and a rare earth element, is present in the sputtering target as said material or phase;

wherein the sputtering target is a sintered body of a powder compact;

wherein a difference between a composition of the sputtering target and a reference composition is within ±3% both in an in-plane direction of a sputter surface and in a target thickness direction under (Condition 1) or (Condition 2), the reference composition being an average of compositions at 18 sites in total measured in accordance with (Condition 1) or (Condition 2), (Condition 1) in which the sputtering target is a disk-shaped target having a center O and a radius of r, and in the in-plane direction of the sputter surface, measurement sites for composition analysis are 9 sites in total including, on imaginary crossing lines orthogonally crossing at the center O as an intersection, 1 site at the center O, 4 sites 0.45r away from the center O, and 4 sites 0.9r away from the center O, and in the target thickness direction, a cross section including one of the imaginary crossing lines is formed, the cross section is a rectangle having a longitudinal length of t (that is, the sputtering target has a thickness of t) and a lateral length of 2r, and measurement sites for composition analysis are 9 sites in total including 3 sites, on a vertical transversal passing through the center O, at a center X and 0.45t away from the center X upward and downward (referred to as a point a, a point X, and a point b) and including, on the cross section, 2 sites 0.9r away from the point a toward left and right sides, 2 sites 0.9r away from the point X toward the left and right sides, and 2 sites 0.9r away from the point b toward the left and right sides, or (Condition 2) in which the sputtering target has a rectangle shape having a longitudinal length of L1 and a lateral length of L2 (note that examples of the rectangle include a square in which L1 and L2 are equal and a rectangle obtained by developing a side surface of a cylindrical shape having a length J and a circumferential length K, and in a form of the rectangle, L2 corresponds to the length J, L1 corresponds to the circumferential length K, and the length J and the circumferential length K have a relationship of J>K, J=K, or J<K), and in the in-plane direction of the sputter surface, measurement sites for composition analysis are 9 sites in total including, on imaginary crossing lines orthogonally crossing at a center of gravity O as an intersection in a case where each line orthogonally crosses a side of the rectangle, 1 site at the center of gravity O, 2 sites away by a distance of 0.25L1 from the center of gravity O on the imaginary crossing line in the longitudinal direction, 2 sites away by a distance of 0.25L2 from the center of gravity O in the lateral direction, 2 sites away by a distance of 0.45L1 from the center of gravity O in the longitudinal direction, and 2 sites away by a distance of 0.45L2 from the center of gravity O in the lateral direction, and in the target thickness direction, a cross section including one imaginary crossing line that is parallel to any one of a longitudinal side having a length of L1 and a lateral side having a length of L2 is formed, and in a case where the imaginary crossing line is parallel to the lateral side having a length of L2, the cross section is a rectangle having a longitudinal length of t (that is, the sputtering target has a thickness of t) and a lateral length of L2, and measurement sites for composition analysis are 9 sites in total including 3 sites, on a vertical transversal passing through the center of gravity O, at a center X and 0.45t away from the center X upward and downward (referred to as a point a, a point X, and a point b) and including, on the cross section, 2 sites 0.45L2 away from the point a toward left and right sides, 2 sites 0.45L2 away from the point X toward the left and right sides, and 2 sites 0.45L2 away from the point b toward the left and right sides.

2. The sputtering target according to claim 1, wherein the intermetallic compound comprises one, two, three, or four kinds of intermetallic compounds being present in the sputtering target, as said material or phase.

3. The sputtering target according to claim 1, wherein at least one nitride of at least one element selected from the group consisting of aluminum, and a rare earth element, is present in the sputtering target, as said material or phase.

4. The sputtering target according to claim 1, wherein the rare earth element is at least one of scandium or yttrium.

5. The sputtering target according to claim 1, wherein the sputtering target having an oxygen content of 500 ppm or less.

6. The sputtering target according to claim 1, wherein the sputtering target having a composition such that an equilibrium diagram shows no Al phase deposition.

7. The sputtering target according to claim 1, wherein the sputtering target has a microstructure in which an aluminum-rare earth element alloy as the intermetallic compound is present in the aluminum matrix, wherein in the microstructure, a plurality of aluminum-rare earth element alloy particles are attached to each other via the aluminum matrix, each of the aluminum-rare earth element alloy particles is an aggregate of aluminum-rare earth element alloy crystal grains, a boundary between the aluminum-rare earth element alloy crystal grain and an adjacent aluminum-rare earth element alloy crystal grain is a grain boundary, and the aluminum matrix is an aggregate of aluminum crystal grains, wherein a boundary between the aluminum crystal grain and an adjacent aluminum crystal grain is a grain boundary.

* * * * *